United States Patent
Min et al.

(10) Patent No.: US 10,068,929 B2
(45) Date of Patent: Sep. 4, 2018

(54) DISPLAY DEVICE

(71) Applicant: LG DISPLAY CO., LTD., Seoul (KR)

(72) Inventors: Sungjoon Min, Gimpo-si (KR); Chanwoo Lee, Paju-si (KR); Seulki Kim, Seosan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/391,155

(22) Filed: Dec. 27, 2016

(65) Prior Publication Data

US 2018/0061855 A1 Mar. 1, 2018

(30) Foreign Application Priority Data

Aug. 26, 2016 (KR) .......................... 10-2016-0109129

(51) Int. Cl.
*H01L 27/12* (2006.01)
*H01L 23/538* (2006.01)
(Continued)

(52) U.S. Cl.
CPC ............ *H01L 27/124* (2013.01); *H01L 21/50* (2013.01); *H01L 23/5385* (2013.01);
(Continued)

(58) Field of Classification Search
CPC ............... H01L 27/124; H01L 27/1218; H01L 27/1255; H01L 27/3265; H01L 27/3276; H01L 21/50; H01L 23/5385; H01L 23/5387; H01L 51/0096; H01L 2021/60277
(Continued)

(56) References Cited

U.S. PATENT DOCUMENTS

2005/0206828 A1* 9/2005 Lee ...................... H01L 27/3276
349/149
2005/0243234 A1* 11/2005 Jung ................... G02F 1/13452
349/43
(Continued)

FOREIGN PATENT DOCUMENTS

EP 3021363 A1 5/2016
JP 2003-59653 A 2/2003
(Continued)

*Primary Examiner* — Cuong Q Nguyen
*Assistant Examiner* — Tong-Ho Kim
(74) *Attorney, Agent, or Firm* — Birch, Stewart, Kolasch & Birch, LLP

(57) ABSTRACT

A display device can include a substrate including a display area, on which an input image is displayed, and a pad part including a convex portion and a concave portion that are alternately positioned outside the display area and have a height difference between them, and a circuit element attached to the pad part and including a bump inserted into the concave portion of the pad part. The pad part can further include a lower pad electrode electrically connected to a signal line extended from the display area, a first insulating layer disposed on the lower pad electrode in the convex portion, and an upper pad electrode disposed on the first insulating layer, connected to the lower pad electrode through a first contact hole penetrating the first insulating layer and extending into at least a portion of the concave portion.

18 Claims, 15 Drawing Sheets

(51) Int. Cl.
*H01L 21/50* (2006.01)
*H01L 27/32* (2006.01)
*H01L 51/00* (2006.01)
*H01L 21/60* (2006.01)

(52) U.S. Cl.
CPC ...... *H01L 23/5387* (2013.01); *H01L 27/1218* (2013.01); *H01L 27/1255* (2013.01); *H01L 27/3265* (2013.01); *H01L 27/3276* (2013.01); *H01L 51/0096* (2013.01); *H01L 2021/60277* (2013.01)

(58) Field of Classification Search
USPC ............................................ 257/71; 349/149
See application file for complete search history.

(56) References Cited

U.S. PATENT DOCUMENTS

| | | | |
|---|---|---|---|
| 2006/0028606 A1* | 2/2006 | Takeguchi | G02F 1/13454 349/149 |
| 2007/0075313 A1 | 4/2007 | Kwak et al. | |
| 2013/0026476 A1 | 1/2013 | Park et al. | |
| 2014/0140019 A1* | 5/2014 | Park | H05K 3/361 361/749 |
| 2015/0287750 A1 | 10/2015 | Youn et al. | |

FOREIGN PATENT DOCUMENTS

| | | | |
|---|---|---|---|
| JP | 2013-131339 A | 7/2013 | |
| JP | 2015-148728 A | 8/2015 | |
| KR | 10-2005-0003497 A | 1/2005 | |
| KR | 10-2007-0036996 A | 4/2007 | |
| TW | 200937089 A | 9/2009 | |

* cited by examiner

DISPLAY DEVICE

CROSS REFERENCE TO RELATED APPLICATIONS

This application claims the priority benefit of Korean Patent Application No. 10-2016-0109129 filed in the Republic of Korea on Aug. 26, 2016, which is incorporated herein by reference for all purposes as if fully set forth herein.

BACKGROUND OF THE INVENTION

Field of the Invention

Embodiments of the invention relate to a display device.

Discussion of the Related Art

With the development of information technology, the market of display devices used as a connection medium between a user and information is growing. Thus, the use of display devices, such as an organic light emitting diode (OLED) display, a liquid crystal display (LCD), and a plasma display panel (PDP), is on the rise.

An OLED display is a self-emission display device. Thus, the OLED display may be manufactured to have lower power consumption and a thinner profile than a liquid crystal display, which requires a backlight unit. Further, the OLED display has advantages of a wide viewing angle and a fast response time. As a process technology of the OLED display has been developed to mass-produce large-screen displays, the OLED display has expanded its market while competing with the liquid crystal display.

Each pixel of an OLED display includes an organic light emitting diode (OLED) having a self-emitting structure. The OLED display may be variously classified depending on kinds of emission materials, an emission method, an emission structure, a driving method, and the like. For example, the OLED display may be classified into a fluorescent emission type and a phosphorescent emission type depending on the emission method. Further, the OLED display may be classified into a top emission type and a bottom emission type depending on the emission structure. Further, the OLED display may be classified into a passive matrix OLED (PMOLED) display and an active matrix OLED (AMOLED) display depending on the driving method.

A display device includes driver integrated circuits (ICs) that supply a data signal to data lines of a display panel and a gate signal synchronized with the data signal to gate lines of the display panel. As a method for connecting the driver ICs to the display panel, a chip-on film (COF) method for attaching a flexible film, on which ICs are mounted, to the display panel, and a chip-on glass (COG) method for directly mounting ICs on a substrate, etc. are known.

In order to connect the driver IC to the display panel, pads included in the display panel and bumps included in a flexible film are aligned with an anisotropic conductive film interposed between them. Next, a tap bonding process is performed to electrically connect the pads to the bumps, and the pads of the display panel and the flexible film are pressed by each other.

In the tap bonding process, conductive balls constituting the anisotropic conductive film are not positioned between the pad and the bump and may move to the outside because the conductive balls have mobility. Hence, the poor electrical connection (for example, the disconnection) between the pad and the bump may be generated. Further, the flexible film may be deformed by heat generated when the tap bonding process is performed, and a position of the bump may shift due to the deformation of the flexible film. In this instance, because the bump is not disposed at a given position, a poor electrical connection (for example, disconnection) between the pad and the bump may be generated.

SUMMARY OF THE INVENTION

Embodiments of the invention provide a display device capable of easily aligning pads and bumps.

In one aspect, there is provided a display device including a substrate including a display area, on which an input image is displayed, and a pad part including a convex portion and a concave portion that are alternately positioned outside the display area and have a height difference between them; and a circuit element attached to the pad part, the circuit element including a bump inserted into the concave portion of the pad part, in which the pad part includes a lower pad electrode electrically connected to a signal line extended from the display area; a first insulating layer disposed on the lower pad electrode in the convex portion; and an upper pad electrode disposed on the first insulating layer, connected to the lower pad electrode through a first contact hole penetrating the first insulating layer, and extended to at least a portion of the concave portion.

The display device further includes an anisotropic conductive film interposed between the pad part and the circuit element. The upper pad electrode is connected to the bump in the concave portion through the anisotropic conductive film.

The anisotropic conductive film includes an adhesive resin and a plurality of conductive balls distributed in the adhesive resin, and the conductive balls are held in the concave portion.

A shape of the concave portion is defined by a flat surface and two inclined surfaces extended from both sides of the flat surface. The upper pad electrode covers one of the two inclined surfaces and at least a portion of the flat surface.

The pad part includes a first convex portion, a first concave portion, a second convex portion, and a second concave portion that are sequentially disposed. The upper pad electrode includes a first upper pad electrode and a second upper pad electrode that are adjacent to each other. A shape of the first convex portion is defined by a first inclined surface, a first flat surface connected to a side of the first inclined surface, and a second inclined surface connected to a side of the first flat surface. A shape of the first concave portion is defined by the second inclined surface, a second flat surface connected to a side of the second inclined surface, and a third inclined surface connected to a side of the second flat surface. A shape of the second convex portion is defined by the third inclined surface, a third flat surface connected to a side of the third inclined surface, and a fourth inclined surface connected to a side of the third flat surface. A shape of the second concave portion is defined by the fourth inclined surface, a fourth flat surface connected to a side of the fourth inclined surface, and a fifth inclined surface connected to a side of the fourth flat surface. The first upper pad electrode covers at least a portion of the first flat surface, the second inclined surface, and at least a portion of the second flat surface. The second upper pad electrode covers at least a portion of the third flat surface, the fourth inclined surface, and at least a portion of the fourth flat surface.

The pad part further includes a second insulating layer between the lower pad electrode and the first insulating layer.

The second insulating layer is disposed only in the convex portion of the pad part.

The signal line is disposed under the lower pad electrode with a third insulating layer interposed between them, connected to the lower pad electrode through a third contact hole penetrating the third insulating layer, and connected to a gate line of the display area.

The signal line is disposed on the same layer as the lower pad electrode, connected to the lower pad electrode, and connected to a data line of the display area.

The display area includes a plurality of subpixels. Each subpixel includes a semiconductor layer positioned on the substrate; a gate electrode positioned on the semiconductor layer with a gate insulating layer interposed between them and partially overlapping the semiconductor layer; a source electrode and a drain electrode positioned on an interlayer dielectric layer covering the gate electrode and respectively connected to both sides of the semiconductor layer through a source contact hole and a drain contact hole penetrating the interlayer dielectric layer; and a first electrode positioned on a passivation layer and an overcoat layer covering the source electrode and the drain electrode and connected to the drain electrode through a via hole penetrating the passivation layer and the overcoat layer. The upper pad electrode is disposed on the same layer as the first electrode and includes the same material as the first electrode.

In another aspect, there is provided a display device including a substrate including a display area, on which an input image is displayed, and a pad part including a convex portion and a concave portion that are alternately positioned outside the display area and have a height difference between them; and a circuit element attached to the pad part, the circuit element including a bump is inserted into the concave portion of the pad part, in which the pad part includes a lower pad electrode electrically connected to a signal line extended from the display area; a first insulating layer covering the lower pad electrode; an upper pad electrode disposed on the first insulating layer, connected to the lower pad electrode through a first contact hole penetrating the first insulating layer, and extended to at least a portion of the concave portion; and a second insulating layer disposed on the upper pad electrode and exposing the upper pad electrode in the concave portion.

The display device further includes an anisotropic conductive film interposed between the pad part and the circuit element. The upper pad electrode is connected to the bump in the concave portion through the anisotropic conductive film.

The anisotropic conductive film includes an adhesive resin and a plurality of conductive balls distributed in the adhesive resin, and the conductive balls are held in the concave portion.

A shape of the concave portion is defined by a flat surface and two inclined surfaces extended from both sides of the flat surface. The upper pad electrode covers one of the two inclined surfaces and covers at least a portion of the flat surface.

The pad part includes a first convex portion, a first concave portion, a second convex portion, and a second concave portion that are sequentially disposed. The upper pad electrode includes a first upper pad electrode and a second upper pad electrode that are adjacent to each other. The first upper pad electrode is positioned corresponding to the first convex portion and the first concave portion. The second upper pad electrode is positioned corresponding to the second convex portion and the second concave portion.

The signal line is disposed under the lower pad electrode with a third insulating layer interposed between them, connected to the lower pad electrode through a third contact hole penetrating the third insulating layer and electrically connected to a gate line of the display area.

The signal line is disposed on the same layer as the lower pad electrode, connected to the lower pad electrode and connected to a data line of the display area.

The display area includes a plurality of subpixels. Each subpixel includes a semiconductor layer positioned on the substrate; a gate electrode positioned on the semiconductor layer with a gate insulating layer interposed between them and partially overlapping the semiconductor layer; a source electrode and a drain electrode positioned on an interlayer dielectric layer covering the gate electrode and respectively connected to both sides of the semiconductor layer through a source contact hole and a drain contact hole penetrating the interlayer dielectric layer; a first storage capacitor electrode positioned on the interlayer dielectric layer; a second storage capacitor electrode positioned on a passivation layer covering the source electrode and the drain electrode, overlapping the first storage capacitor electrode, and connected to the drain electrode through an auxiliary contact hole penetrating the passivation layer; and a first electrode positioned on an overcoat layer covering the first storage capacitor electrode and connected to the drain electrode through a via hole penetrating the overcoat layer. The upper pad electrode is disposed on the same layer as the second storage capacitor electrode and includes the same material as the second storage capacitor electrode.

The display device further includes an auxiliary pad electrode covering the exposed upper pad electrode. The auxiliary pad electrode is disposed on the same layer as the first electrode and includes the same material as the first electrode.

The first and second storage capacitor electrodes include a transparent conductive material.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be noted that a detailed description of known arts will be omitted if it is determined that the detailed description of the known arts can obscure the embodiments of the invention. In the following description, the same component used in embodiments is representatively described in a first embodiment, and a description thereof may be omitted in the other embodiments.

A display device according to an embodiment of the invention may be implemented as a liquid crystal display (LCD), a field emission display (FED), a plasma display panel (PDP), an organic light emitting diode (OLED) display, an electrophoresis display, and the like. For convenience of explanation, embodiments of the invention are described using an OLED display by way of example, but embodiments are not limited thereto.

An OLED display includes an emission layer of an organic material between a first electrode serving as an anode and a second electrode serving as a cathode. The OLED display is a self-emission display device configured to form hole-electron pairs, excitons, by combining holes received from the first electrode and electrons received from the second electrode inside the emission layer and emit light by energy generated when the excitons return to a ground level or a lower energy level. The OLED display according to embodiments of the invention may use a glass substrate as well as a plastic substrate.

Hereinafter, embodiments of the invention will be described below with reference to FIGS. 1 to 15.

Figure 1:
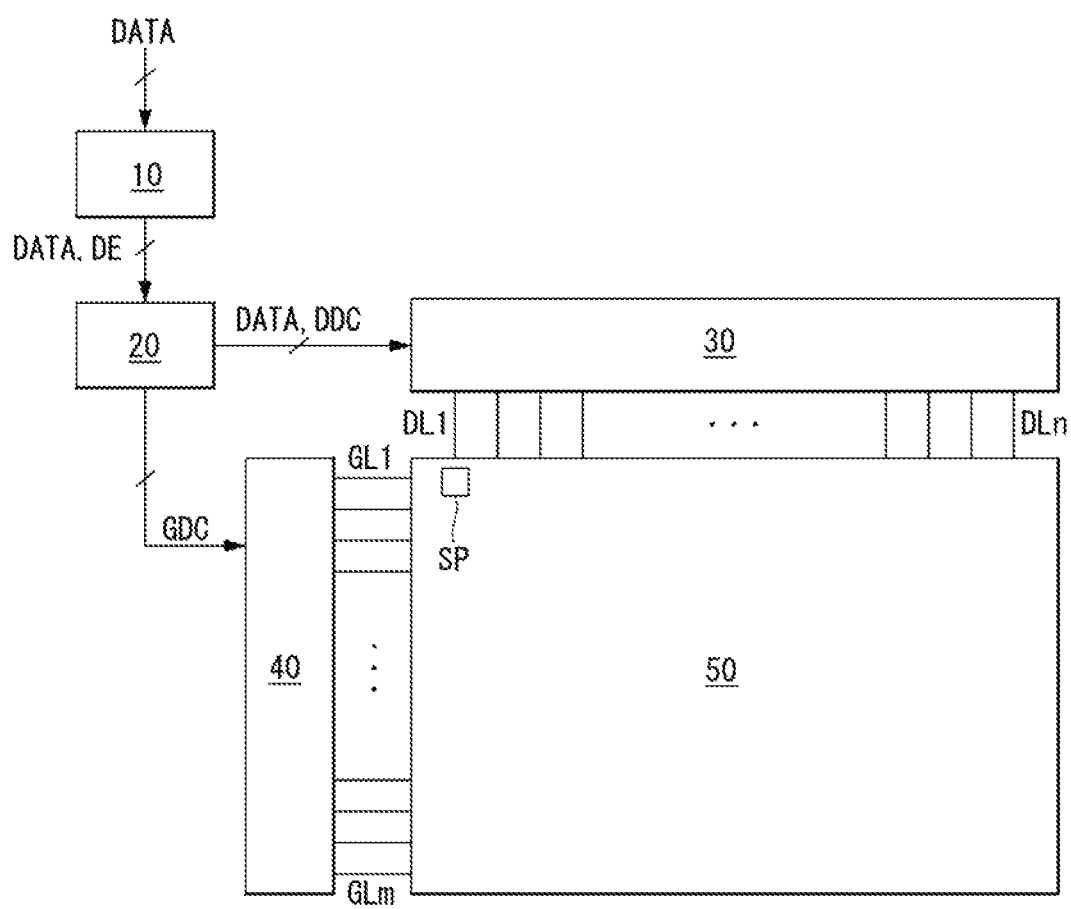
FIG. 1 is a schematic block diagram of an organic light emitting diode (OLED) display.
Figure 2:
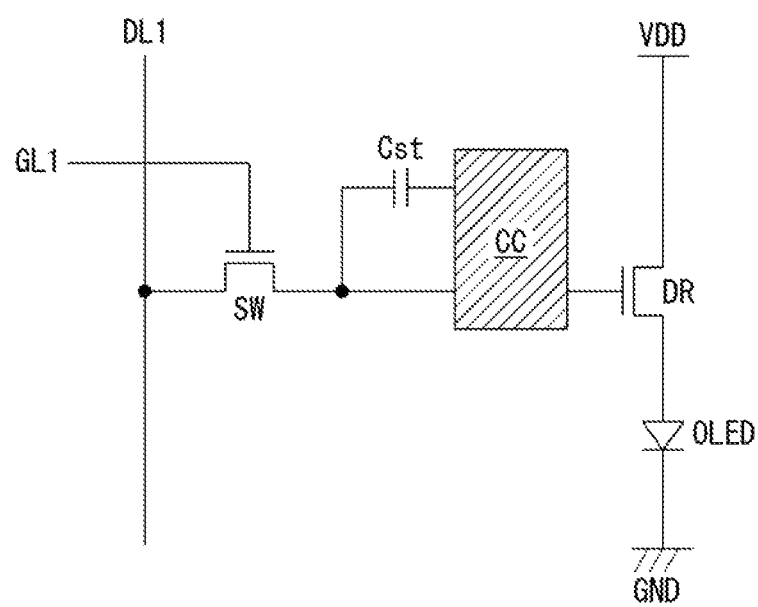
FIG. 2 illustrates a first example of a circuit configuration of a subpixel.
Figure 3:
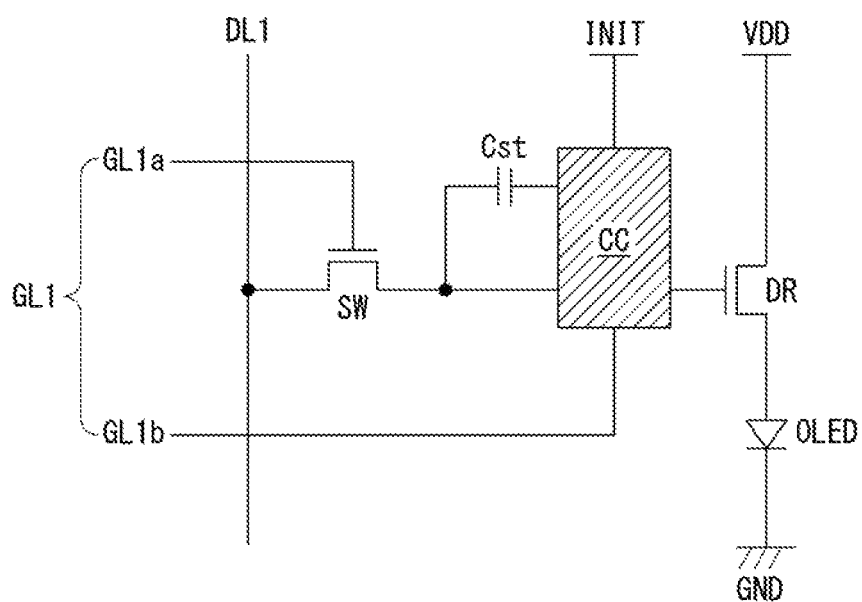
FIG. 3 illustrates a second example of a circuit configuration of a subpixel.
Figure 4:
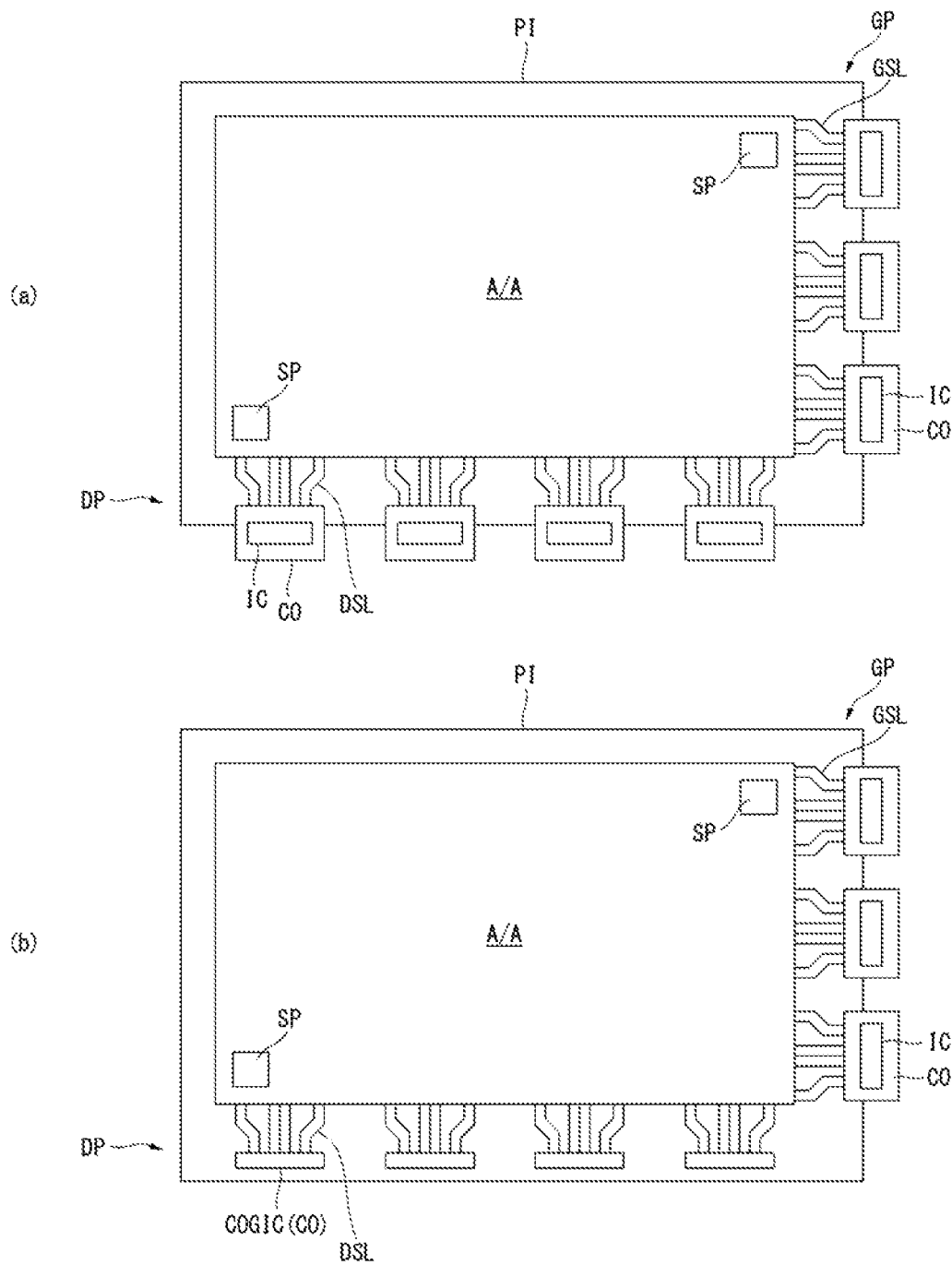
FIG. 4 is a plan view of an OLED display according to an embodiment of the invention.

FIG. 1 is a schematic block diagram of an OLED display. FIG. 2 illustrates a first example of a circuit configuration of a subpixel. FIG. 3 illustrates a second example of a circuit configuration of a subpixel. FIG. 4 is a plan view of an OLED display according to an embodiment of the invention.

Referring to FIG. 1, an OLED display according to an embodiment of the invention includes an image processing unit 10, a timing controller 20, a data driver 30, a gate driver 40, and a display panel 50.

The image processing unit 10 outputs a data signal DATA and a data enable signal DE supplied from the outside. The image processing unit 10 may output one or more of a vertical sync signal, a horizontal sync signal, and a clock signal in addition to the data enable signal DE. The image processing unit 10 is formed on a system circuit board in an integrated circuit (IC) form.

The timing controller 20 receives the data signal DATA and driving signals including the data enable signal DE or the vertical sync signal, the horizontal sync signal, the clock signal, etc. from the image processing unit 10.

The timing controller 20 outputs a gate timing control signal GDC for controlling operation timing of the gate driver 40 and a data timing control signal DDC for controlling operation timing of the data driver 30 based on the driving signals. The timing controller 20 is formed on a control circuit board in an IC form.

The data driver 30 samples and latches the data signal DATA received from the timing controller 20 in response to the data timing control signal DDC supplied from the timing controller 20 and converts the sampled and latched data signal DATA using gamma reference voltages. The data driver 30 outputs the converted data signal DATA to data lines DL1 to DLn. The data driver 30 is attached to a substrate in an IC form.

The gate driver 40 outputs a gate signal while shifting a level of a gate voltage in response to the gate timing control signal GDC supplied from the timing controller 20. The gate driver 40 outputs the gate signal to gate lines GL1 to GLm. The gate driver 40 is formed on a gate circuit board in an IC form or is formed on the display panel 50 in a gate-in panel (GIP) manner.

The display panel 50 displays an image in response to the data signal DATA and the gate signal respectively received from the data driver 30 and the gate driver 40. The display panel 50 includes subpixels SP for displaying an image.

Referring to FIG. 2, each subpixel includes a switching transistor SW, a driving transistor DR, a compensation circuit CC, and an organic light emitting diode (OLED). The OLED operates to emit light based on a driving current generated by the driving transistor DR.

The switching transistor SW performs a switching operation so that a data signal supplied through a first data line DL1 is stored in a capacitor as a data voltage in response to a gate signal supplied through a first gate line GL1. The driving transistor DR enables a driving current to flow between a high potential power line VDD and a low potential power line GND based on the data voltage stored in the capacitor. The compensation circuit CC is a circuit for compensating for a threshold voltage of the driving transistor DR. A capacitor connected to the switching transistor SW or the driving transistor DR may be mounted inside the compensation circuit CC.

The compensation circuit CC includes one or more thin film transistors (TFTs) and a capacitor. Configuration of the compensation circuit CC may be variously changed depending on a compensation method. A detailed description thereof may be briefly made or may be entirely omitted.

As shown in FIG. 3, the subpixel including the compensation circuit CC may further include a signal line and a power line for driving a compensation TFT and supplying a predetermined signal or electric power. The added signal line may be defined as a 1-2 gate line GL1b for driving the compensation TFT included in the subpixel. In FIG. 3, "GL1a" is a 1-1 gate line for driving the switching transistor SW. The added power line may be defined as an initialization power line INIT for initializing a predetermined node of the subpixel at a predetermined voltage. However, this is merely an example, and the embodiment of the invention is not limited thereto.

FIGS. 2 and 3 illustrate that one subpixel includes the compensation circuit CC by way of example. However, the compensation circuit CC may be omitted when an object (for example, the data driver 30) to be compensated is positioned outside the subpixel. The subpixel has a configuration of 2T(Transistor)1C(Capacitor) in which the switching transistor SW, the driving transistor DR, the capacitor, and the OLED are provided. However, when the compensation circuit CC is added to the subpixel, the subpixel may have various configurations such as 3T1C, 4T2C, 5T2C, 6T2C, 7T2C, and the like.

Also, FIGS. 2 and 3 illustrate that the compensation circuit CC is positioned between the switching transistor SW and the driving transistor DR by way of an example. However, the compensation circuit CC may be further positioned between the driving transistor DR and the OLED. The position and the structure of the compensation circuit CC are not limited to the ones illustrated in FIGS. 2 and 3.

Referring to FIG. 4, an OLED display includes a substrate PI and a circuit element CO. The substrate PI includes a display area A/A and a gate pad part GP and a data pad part DP positioned outside the display area A/A. A plurality of subpixels SP is disposed in the display area A/A. The subpixels SP are disposed in R (red), G (green), and B (blue) subpixel arrangement or R, G, B, W (white) subpixel arrangement in the display area A/A to represent full color. The subpixels SP may be defined by gate lines and data lines intersecting each other.

The gate pad part GP is disposed on one side (for example, the left or right side) of the display area A/A. The gate pad part GP includes a plurality of gate pads. The gate pads are electrically connected to gate signal lines GSL extended from the display area A/A.

The data pad part DP is disposed on one side (for example, the lower side) of the display area A/A. The data pad part DP includes a plurality of data pads. The data pads are electrically connected to data signal lines DSL extended from the display area A/A.

The circuit element CO includes bumps (or terminals). The bumps of the circuit element CO are respectively attached to the pads of the pad parts through an anisotropic conductive film. Referring to (a) of FIG. 4, the circuit element CO may be a chip-on film (COF) that is configured such that driver integrated circuits (ICs) are mounted on a flexible film. Further, referring to (b) of FIG. 4, the circuit element CO may be a chip-on glass (COG) type IC (COGIC) that is configured such that driver ICs are directly attached to the pads on the substrate through a COG process. Further, the circuit element CO may be a flexible circuit, for example, a flexible flat cable (FFC) or a flexible printed circuit (FPC). Embodiments of the invention are described using a COF as an example of the circuit element CO, but are not limited thereto.

The gate signal lines GSL supply the gate lines of the display area A/A with a gate signal received through the circuit element CO attached to the gate pad part GP. The data signal lines DSL supply the data lines of the display area A/A with a data signal received through the circuit element CO attached to the data pad part DP.

First Embodiment

Figure 5:
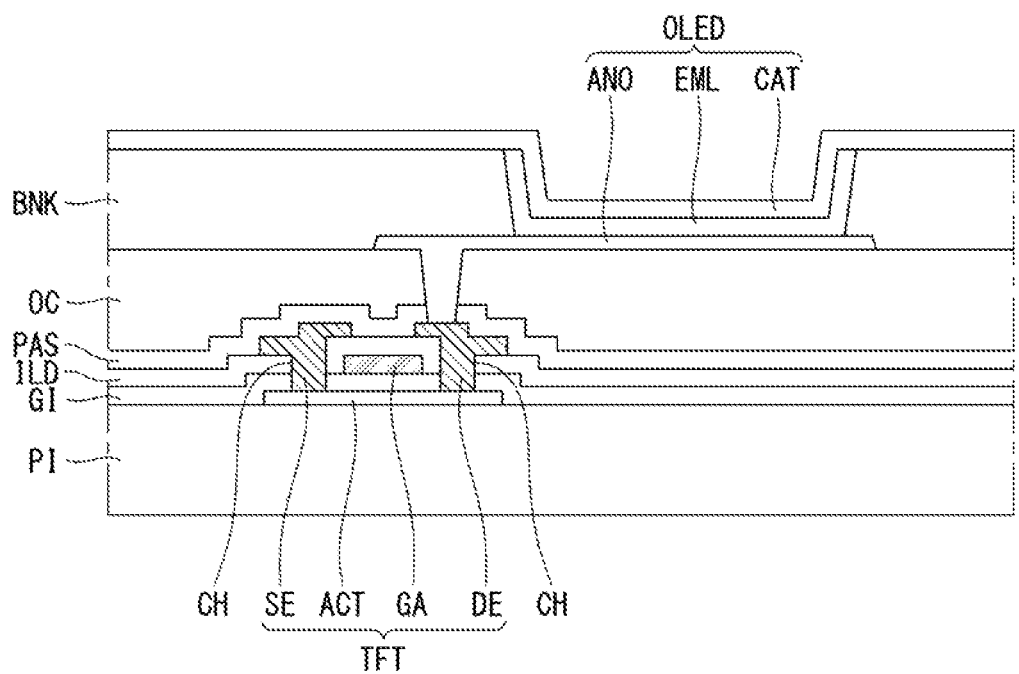
FIG. 5 is a cross-sectional view illustrating a subpixel of an OLED display according to a first embodiment of the invention.
Figure 6:
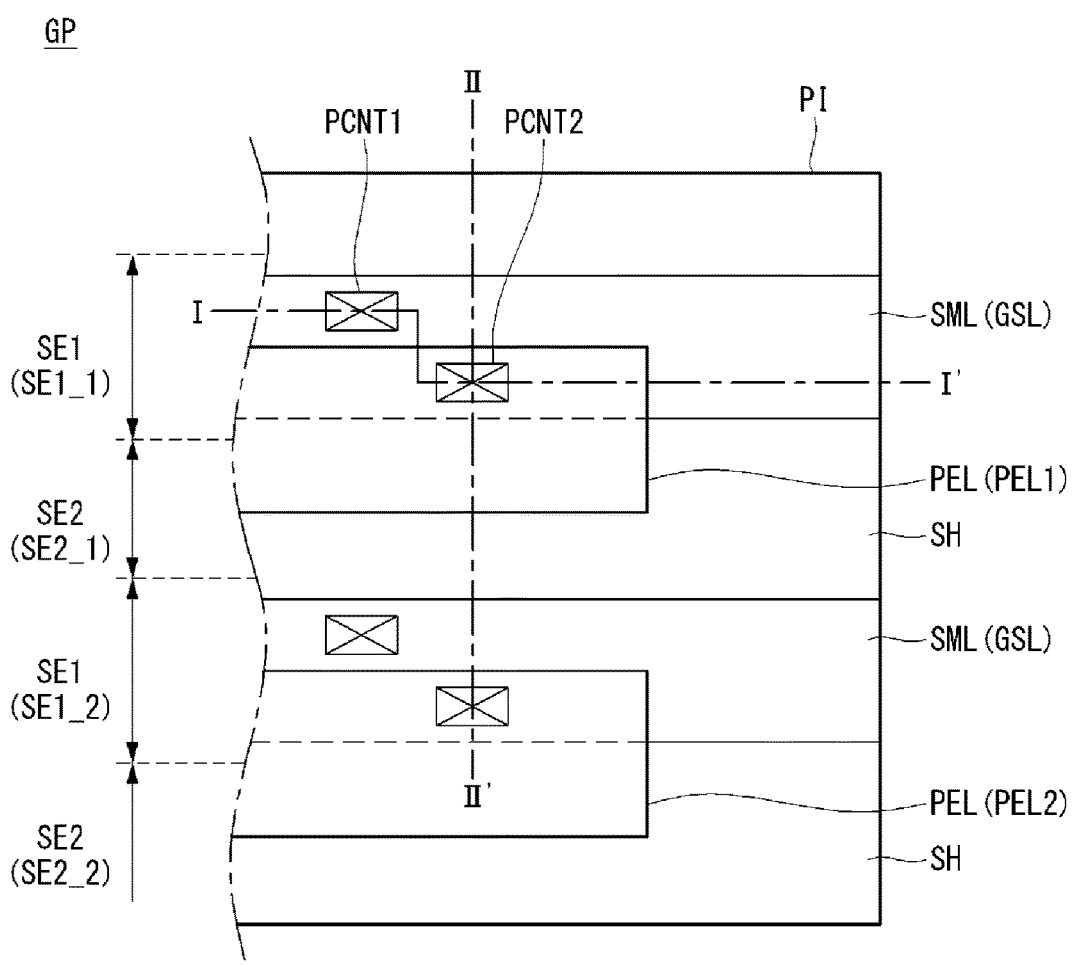
FIG. 6 is an enlarged plan view of a gate pad part according to a first embodiment of the invention.
Figure 7:
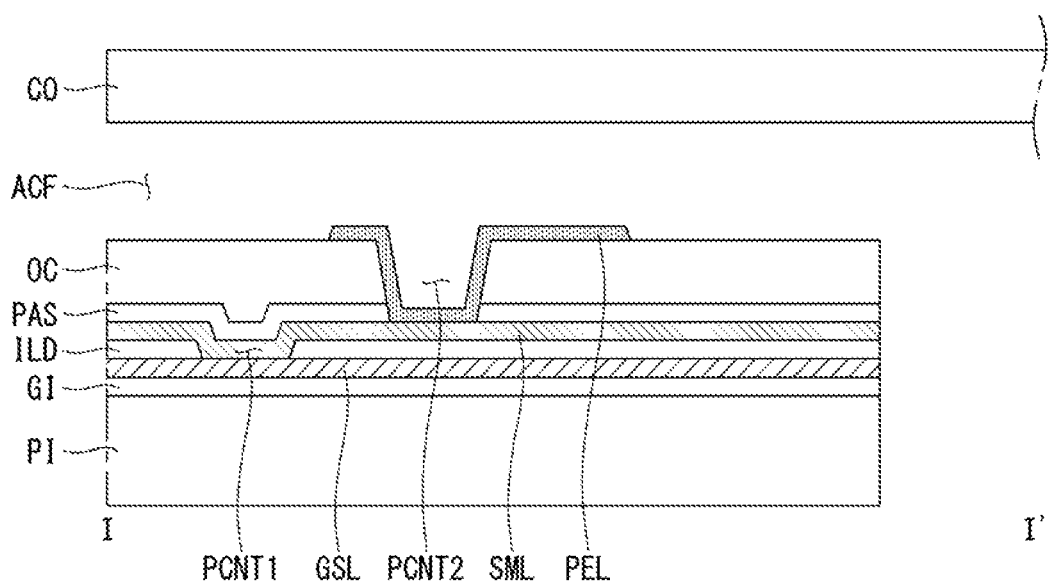
FIG. 7 is a cross-sectional view taken along line I-I' of FIG. 6.
Figure 8:
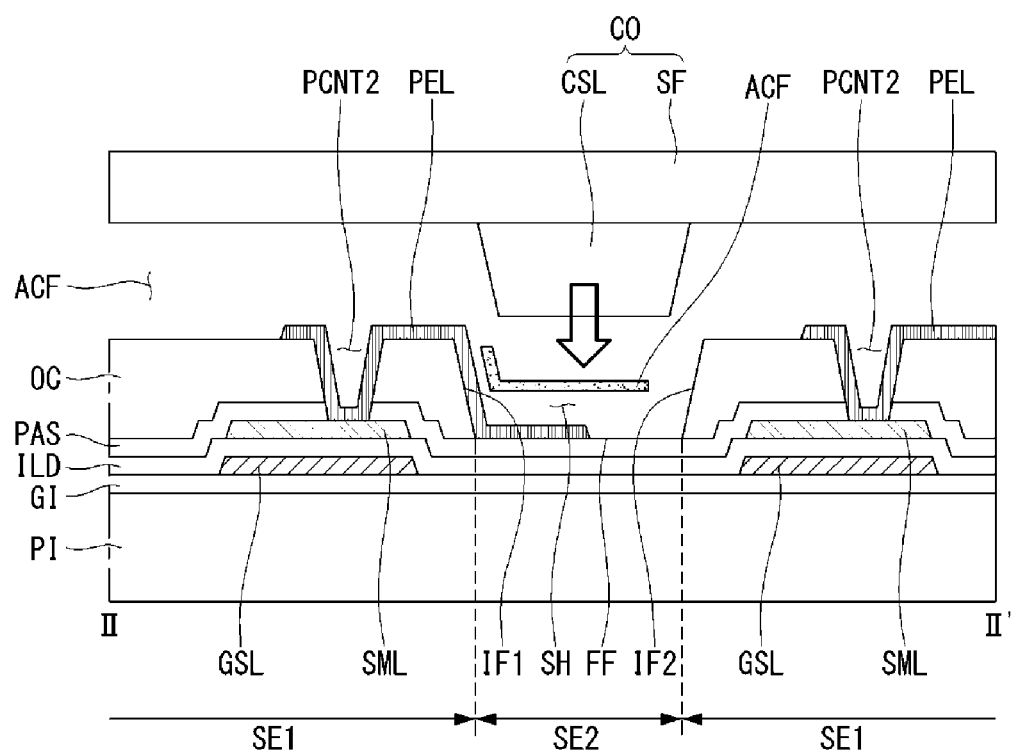
FIG. 8 is a cross-sectional view taken along line II-II' of FIG. 6.
Figure 9:
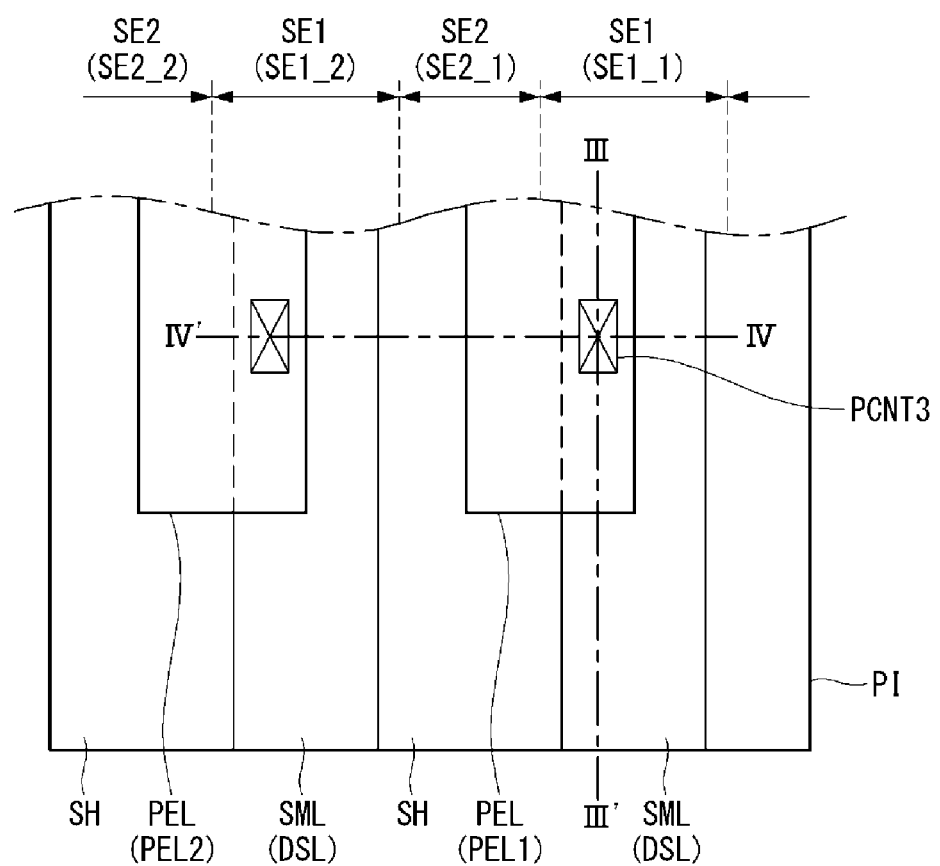
FIG. 9 is an enlarged plan view of a data pad part according to a first embodiment of the invention.
Figure 10:
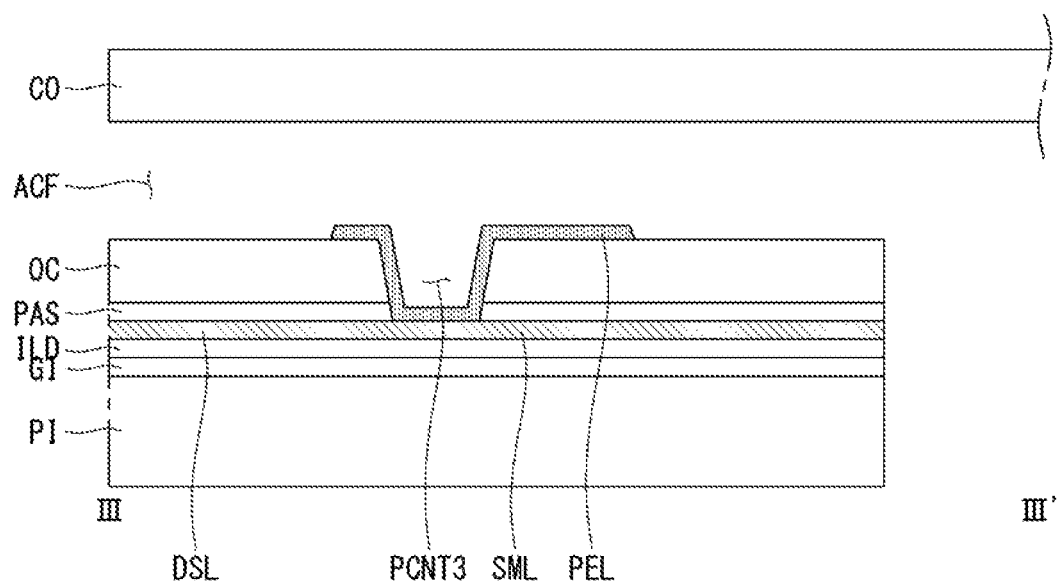
FIG. 10 is a cross-sectional view taken along line of FIG. 9.
Figure 11:
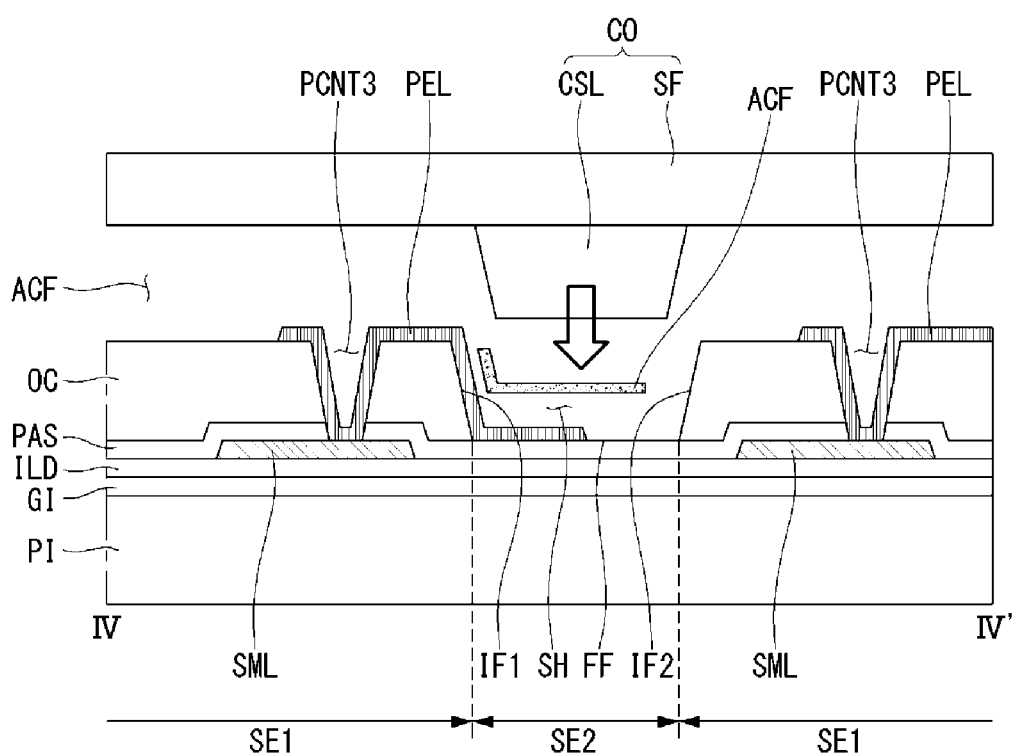
FIG. 11 is a cross-sectional view taken along line IV-IV' of FIG. 9.

FIG. 5 is a cross-sectional view illustrating a subpixel of an OLED display according to a first embodiment of the invention. FIG. 6 is an enlarged plan view of a gate pad part according to the first embodiment of the invention. FIG. 7 is a cross-sectional view taken along line I-I' of FIG. 6. FIG. 8 is a cross-sectional view taken along line II-II' of FIG. 6. FIG. 9 is an enlarged plan view of a data pad part according to the first embodiment of the invention. FIG. 10 is a cross-sectional view taken along line III-III' of FIG. 9. FIG. 11 is a cross-sectional view taken along line IV-IV' of FIG. 9.

Referring to FIG. 5, an OLED display according to a first embodiment of the invention includes a substrate PI. The substrate PI may be made of plastic material. For example, the substrate PI may include at least one of polyimide (PI), polyethylene terephthalate (PET), polyethylene naphthalate (PEN), polycarbonate (PC), polyethersulfone (PES), polyarylate (PAR), polysulfone (PSF), or cyclic olefin copolymer (COC).

In addition, a buffer layer and a shield layer may be formed on the substrate PI. For example, the buffer layer may include a first buffer layer and a second buffer layer, and the shield layer may be interposed between the first buffer layer and the second buffer layer. The first buffer layer may protect a thin film transistor formed in a subsequent process from impurities, for example, alkali ions discharged from the substrate PI. The first buffer layer may be a silicon oxide (SiOx) layer, a silicon nitride (SiNx) layer, or a multilayer thereof. The shield layer may prevent a reduction in a panel driving current which may be generated by using a polyimide substrate. The second buffer may protect a thin film transistor formed in a subsequent process from impurities, for example, alkali ions discharged from the shield layer. The second buffer layer may be a silicon oxide (SiOx) layer, a silicon nitride (SiNx) layer, or a multilayer thereof.

A semiconductor layer ACT is positioned on the substrate PI and may be formed of a silicon semiconductor or an oxide semiconductor. The silicon semiconductor may include amorphous silicon or crystallized polycrystalline silicon. The polycrystalline silicon has a high mobility (for example, more than 100 $cm^2/Vs$), low energy power consumption, and excellent reliability, and thus can be applied to a gate driver and/or a multiplexer (MUX) for use in a driving element or applied to a driving TFT of each pixel of the OLED display. Because the oxide semiconductor has a low off-current, the oxide semiconductor is suitable for a switching TFT that has a short on-time and a long off-time. Further, because the oxide semiconductor increases a voltage hold time of the pixel due to the low off-current, the oxide semiconductor is suitable for a display device requiring a low-speed drive and/or low power consumption. In addition, the semiconductor layer ACT includes a drain region and a source region each including p-type or n-type impurities, and also includes a channel region between the drain region and the source region.

A gate insulating layer GI is positioned on the semiconductor layer ACT and may be a silicon oxide (SiOx) layer, a silicon nitride (SiNx) layer, or a multilayer thereof. A gate electrode GA is positioned on the gate insulating layer GI at a location corresponding to the channel region of the semiconductor layer ACT. The gate electrode GA may be formed of one of molybdenum (Mo), aluminum (Al), chrome (Cr), gold (Au), titanium (Ti), nickel (Ni), neodymium (Nd), and copper (Cu), or a combination thereof. Further, the gate electrode GA may be a multilayer formed of one of molybdenum (Mo), aluminum (Al), chrome (Cr), gold (Au), titanium (Ti), nickel (Ni), neodymium (Nd), and copper (Cu), or a combination thereof. For example, the gate electrode GA may be formed as a double layer of Mo/Al—Nd or Mo/Al. Also, the gate insulating layer GI and the gate electrode GA may be patterned using one mask and may be formed to have the same area.

An interlayer dielectric layer ILD is positioned on the gate electrode GA and insulates the gate electrode GA. The interlayer dielectric layer ILD may be a silicon oxide (SiOx) layer, a silicon nitride (SiNx) layer, or a multilayer thereof. Contact holes CH exposing a portion of the semiconductor layer ACT are formed in a portion of each of the interlayer dielectric layer ILD and the gate insulating layer GI.

A drain electrode DE and a source electrode SE are positioned on the interlayer dielectric layer ILD. The drain electrode DE is connected to the semiconductor layer ACT through the contact hole CH exposing the drain region of the semiconductor layer ACT, and the source electrode SE is connected to the semiconductor layer ACT through the contact hole CH exposing the source region of the semiconductor layer ACT. Each of the source electrode SE and the drain electrode DE may be formed as a single layer or a multilayer. When each of the source electrode SE and the drain electrode DE is formed as the single layer, each of the source electrode SE and the drain electrode DE may be formed of one of molybdenum (Mo), aluminum (Al), chrome (Cr), gold (Au), titanium (Ti), nickel (Ni), neodymium (Nd), and copper (Cu), or a combination thereof. When each of the source electrode SE and the drain electrode DE is formed as the multilayer, each of the source electrode SE and the drain electrode DE may be formed as a double layer of Mo/Al—Nd or a triple layer of Ti/Al/Ti, Mo/Al/Mo or Mo/Al-Nd/Mo. Thus, a thin film transistor TFT including the semiconductor layer ACT, the gate electrode GA, the source electrode SE, and the drain electrode DE is formed.

Further, a passivation layer PAS is positioned on the substrate PI including the thin film transistor TFT. The passivation layer PAS is an insulating layer protecting the component underlying the passivation layer PAS and may be a silicon oxide (SiOx) layer, a silicon nitride (SiNx) layer, or a multilayer thereof. An overcoat layer OC is also positioned on the passivation layer PAS. The overcoat layer OC may be a planarization layer for reducing a height difference of an underlying structure and may be formed of an organic material such as polyimide, benzocyclobutene-based resin, and acrylate. For example, the overcoat layer OC may be formed through a spin-on glass (SOG) method for coating the organic material in a liquid state and then curing the organic material.

A via hole exposing the drain electrode DE of the thin film transistor TFT is positioned in a portion of the overcoat layer OC. An organic light emitting diode OLED is positioned on the overcoat layer OC. More specifically, a first electrode ANO is positioned on the overcoat layer OC. The first electrode ANO serves as a pixel electrode and connects to the drain electrode DE of the thin film transistor TFT through the via hole. The first electrode ANO is an anode and may be formed of a transparent conductive material such as indium tin oxide (ITO), indium zinc oxide (IZO), and zinc oxide (ZnO). When the first electrode ANO is a reflective electrode, the first electrode ANO may further include a reflective layer. The reflective layer may be formed of aluminum (Al), copper (Cu), silver (Ag), nickel (Ni), palladium (Pd) or a combination thereof. Preferably, the reflective layer may be formed of an Ag/Pd/Cu (APC) alloy.

In addition, a bank layer BNK defining pixels is positioned on the substrate PI including the first electrode ANO. The bank layer BNK may be formed of an organic material such as polyimide, benzocyclobutene-based resin, and acrylate. The bank layer BNK exposes a portion of the first electrode ANO. An emission layer EML is positioned on the first electrode ANO exposed by the bank layer BNK. The emission layer EML is a layer, in which electrons and holes combine and emit light. A hole injection layer and/or a hole transport layer may be positioned between the emission layer EML and the first electrode ANO, and an electron injection layer and/or an electron transport layer may be positioned on the emission layer EML.

A second electrode CAT is positioned on the emission layer EML and may be positioned on an entire surface of the display area A/A (see FIG. 4) of the substrate PI. In addition, the second electrode CAT is a cathode electrode and may be formed of magnesium (Mg), calcium (Ca), aluminum (Al), silver (Ag), or a combination thereof each having a low work function. When the second electrode CAT is a transmissive electrode, the second electrode CAT may be thin enough to transmit light. Further, when the second electrode CAT is a reflective electrode, the second electrode CAT may be thick enough to reflect light.

Referring to FIG. 6, a display device according to the first embodiment of the invention includes a gate pad part GP positioned on a substrate PI. The gate pad part GP includes a convex portion SE1 and a concave portion SE2. The convex portion SE1 has a cross-sectional shape that convexly protrudes, and the concave portion SE2 has a cross-sectional shape that is concavely depressed. The convex portion SE1 and the concave portion SE2 are alternately disposed and have a height different at a boundary between the convex portion SE1 and the concave portion SE2.

The convex portion SE1 and the concave portion SE2 may be formed by patterning at least one insulating layer. Namely, at least one insulating layer on the substrate PI may have a sink groove SH. In this instance, a formation area of the sink groove SH may be defined as the concave portion SE2. A portion of the insulating layer, that remains outside the sink groove SH, may be defined as the convex portion SE1. The insulating layer pattern may cause the convex portion SE1 and the concave portion SE2 to have a sufficient height difference between them.

A bump CSL of a circuit element CO is positioned in the concave portion SE2. Namely, the gate pad part GP includes the plurality of concave portions SE2, and the plurality of bumps CSL may be respectively inserted into the plurality of concave portions SE2. The concave portion SE2 has an inner space capable of holding the bump CSL.

The gate pad part GP includes a plurality of gate pads. Each gate pad includes a lower gate pad electrode SML and an upper gate pad electrode PEL.

The lower gate pad electrode SML is connected to a gate signal line GSL. The lower gate pad electrode SML and the gate signal line GSL are electrically connected to each other through a first contact hole PCNT1 penetrating at least one insulating layer with at least one insulating layer interposed between them.

The lower gate pad electrodes SML are spaced apart from one another by a predetermined distance. The lower gate pad electrode SML may have an area relatively larger than the gate signal line GSL. Hence, the embodiment of the invention can sufficiently secure a contact area, in which the lower gate pad electrode SML and the upper gate pad electrode PEL can contact each other, and thus can prevent or minimize a defective contact.

The upper gate pad electrode PEL is connected to the lower gate pad electrode SML. The upper gate pad electrode PEL and the lower gate pad electrode SML are electrically connected to each other through a second contact hole PCNT2 penetrating at least one insulating layer with at least one insulating layer interposed between them. The upper gate pad electrode PEL is electrically connected to the lower gate pad electrode SML, the gate signal line GSL, and the gate line of the display area A/A, and transfers a gate signal supplied through the circuit element CO to the subpixel of the display area A/A.

The upper gate pad electrodes PEL are spaced apart from one another by a predetermined distance. The upper gate pad electrode PEL may have an area relatively larger than the gate signal line GSL. Hence, the embodiment of the invention can sufficiently secure a contact area, in which the lower gate pad electrode SML and the upper gate pad electrode PEL can contact each other, and thus can prevent or minimize a defective contact.

The upper gate pad electrode PEL overlaps the convex portion SE1 and extends into at least a portion of the concave portion SE2. For example, the gate pad part GP includes a first convex portion SE1_1, a first concave portion SE2_1, a second convex portion SE1_2, and a second concave portion SE2_2, which are sequentially disposed. The upper gate pad electrode PEL includes a first upper gate pad electrode PEL1 and a second upper gate pad electrode PEL2 that are adjacent to each other. The first upper gate pad electrode PEL1 is positioned corresponding to the first convex portion SE1_1 and the first concave portion SE2_1, and the second upper gate pad electrode PEL2 is positioned corresponding to the second convex portion SE1_2 and the second concave portion SE2_2. This means that the first and second upper gate pad electrodes PEL1 and PEL2 are not simultaneously positioned in the same concave portion SE2, rather PEL1 and PEL2 reside in different concave portions (e.g., SE2_1 and SE2_2).

The upper gate pad electrode PEL may have a shape, in which the upper gate pad electrode PEL on the lower gate pad electrode SML is shifted in one direction when viewed from the plan, so that the upper gate pad electrode PEL can be positioned on both the convex portion SE1 and the concave portion SE2 that are adjacent to each other. All of the upper gate pad electrodes PEL are shifted in the same direction.

Referring to FIGS. 7 and 8, a gate insulating layer GI is positioned on the substrate PI of the gate pad part GP. The gate signal line GSL is positioned on the gate insulating layer GI and indicates a signal line extended from the gate line of the display area A/A.

An interlayer dielectric layer ILD is positioned on the gate signal line GSL and includes a first contact hole PCNT1. The first contact hole PCNT1 penetrates the interlayer dielectric layer ILD and exposes a portion of the gate signal line GSL.

The lower gate pad electrode SML is positioned on the interlayer dielectric layer ILD having the first contact hole PCNT1. The lower gate pad electrode SML is connected to the gate signal line GSL through the first contact hole PCNT1. The lower gate pad electrode SML may be a pattern that is formed during the same process as the source electrode and the drain electrode of the display area A/A together with them. Thus, the lower gate pad electrode SML may be formed on the same layer as the source electrode and the drain electrode of the display area A/A and may include the same material as them.

A passivation layer PAS is positioned on the lower gate pad electrode SML. An overcoat layer OC is also positioned on the passivation layer PAS. The overcoat layer OC has a sink groove SH between the adjacent lower gate pad electrodes SML. The sink groove SH penetrates the overcoat layer OC and exposes at least a portion of the passivation layer PAS. A formation area of the sink groove SH may be defined as the concave portion SE2, and the outside of the sink groove SH may be defined as the convex portion SE1.

The sink groove SH has a sufficient inner space capable of holding the bump CSL of the circuit element CO. In another embodiment, the sink groove SH between the adjacent lower gate pad electrodes SML may penetrate the overcoat layer OC and the passivation layer PAS and may expose a portion of the interlayer dielectric layer ILD.

The overcoat layer OC and the passivation layer PAS include a second contact hole PCNT2. The second contact hole PCNT2 penetrates the overcoat layer OC and the passivation layer PAS and exposes a portion of the lower gate pad electrode SML.

The upper gate pad electrode PEL is positioned on the overcoat layer OC having the second contact hole PCNT2 and the sink groove SH. The upper gate pad electrode PEL is connected to the lower gate pad electrode SML through the second contact hole PCNT2. The upper gate pad electrode PEL may be formed of a transparent conductive material such as indium tin oxide (ITO), indium zinc oxide (IZO), and zinc oxide (ZnO). The upper gate pad electrode PEL may be a pattern that is formed during the same process as the first electrode ANO (see FIG. 5) of the display area A/A together with it. Thus, the upper gate pad electrode PEL may be formed on the same layer as the first electrode ANO (see FIG. 5) of the display area A/A and may include the same material as it. Hence, a signal path is formed, which connects the upper gate pad electrode PEL, the lower gate pad electrode SML and the gate signal line GSL.

The upper gate pad electrode PEL is formed along a height difference between the convex portion SE1 and the concave portion SE2 (e.g., PEL is formed on a stepped portion) and extends to the inside of the concave portion SE2. More specifically, a shape of the concave portion SE2 is defined by a flat surface FF and two inclined surfaces IF1 and IF2 extended from both sides of the flat surface FF. In this instance, the upper gate pad electrode PEL covers one of the two inclined surfaces IF1 and IF2 and also covers at least a portion of the flat surface FF.

The circuit element CO includes a bump CSL included in a flexible film SF. An anisotropic conductive film ACF is formed by distributing a plurality of conductive balls in an adhesive resin and electrically connects the pads to the bumps CSL while attaching the substrate PI to the circuit element CO. The conductive balls of the anisotropic conductive film ACF are held in the concave portion SE2 and are positioned between the upper gate pad electrode PEL and the bump CSL, thereby electrically connecting the upper gate pad electrode PEL to the bump CSL.

The concave portion SE2 holds the conductive balls and prevents the separation of the conductive balls. Thus, the conductive balls are not positioned between the bump CSL and the upper gate pad electrode PEL by a pressurization operation provided during a bonding process and are distributed in the concave portion SE2. Hence, the disconnection between the pad and the bump CSL can be prevented.

The movement of the bump CSL is limited by the height difference between the convex portion SE1 and the concave portion SE2 at a boundary between them. Hence, an external force provided can prevent the bump CSL from moving outside of the concave portion SE2 or from being excessively shifted from its location (e.g., the inclined surfaces IF1 and IF2 hold the bump CSL securely in place). Thus, a defective contact between the bump CSL and the upper gate pad electrode PEL can be prevented or minimized.

When a bonding process for attaching the circuit element CO to the pad part is performed, the bump CSL may be excessively shifted by a thermal deformation of the flexible film. In this instance, the embodiment of the invention can prevent a misalignment by holding the bump CSL in the concave portion SE2.

When the bumps CSL and the gate pads are aligned to attach the circuit element CO to the gate pad part GP, the bumps CSL are guided to the inside of the concave portion SE2 due to the shape of the concave portion SE2. Hence, the bumps CSL are self-aligned and are accurately aligned at a predetermined location. The embodiment of the invention can easily align the bumps CSL and the pads.

Referring to FIG. 9, the display device according to the first embodiment of the invention includes a data pad part DP positioned on the substrate PI. The data pad part DP includes a convex portion SE1 and a concave portion SE2. The convex portion SE1 has a cross-sectional shape that convexly protrudes, and the concave portion SE2 has a cross-sectional shape that is concavely depressed. The convex portion SE1 and the concave portion SE2 are alternately disposed and have a height different at a boundary between the convex portion SE1 and the concave portion SE2 (e.g., a stepped portion between SE1 and SE2).

The convex portion SE1 and the concave portion SE2 may be formed by patterning at least one insulating layer. Namely, at least one insulating layer on the substrate PI may have a sink groove SH. In this instance, a formation area of the sink groove SH may be defined as the concave portion SE2. A portion of the insulating layer, that remains outside the sink groove SH, may be defined as the convex portion SE1. The insulating layer pattern may cause the convex portion SE1 and the concave portion SE2 to have a sufficient height difference between them.

A bump CSL of a circuit element CO is positioned in the concave portion SE2. Namely, the data pad part DP includes the plurality of concave portions SE2, and the plurality of bumps CSL may be respectively inserted into the plurality of concave portions SE2. The concave portion SE2 has an inner space capable of holding the bump CSL.

The data pad part DP includes a plurality of data pads. Each data pad includes a lower data pad electrode SML and an upper data pad electrode PEL.

The lower data pad electrode SML is connected to a data signal line DSL. The lower data pad electrode SML is disposed on the same layer as the data signal line DSL and electrically connects to the data signal line DSL. The lower data pad electrode SML and the data signal line DSL may be formed as one body.

The lower data pad electrodes SML are spaced apart from one another by a predetermined distance. The lower data pad electrode SML may have an area relatively larger than the data signal line DSL. Hence, the embodiment of the invention can sufficiently secure a contact area, in which the lower data pad electrode SML and the upper data pad electrode PEL can contact each other, and thus can prevent or minimize a defective contact.

The upper data pad electrode PEL is connected to the lower data pad electrode SML. More specifically, the upper data pad electrode PEL and the lower data pad electrode SML are electrically connected to each other through a third contact hole PCNT3 penetrating at least one insulating layer with at least one insulating layer interposed between them. The upper data pad electrode PEL is electrically connected to the lower data pad electrode SML, the data signal line DSL, and the data line of the display area A/A, and transfers a data signal supplied through the circuit element CO to the subpixel of the display area A/A.

The upper data pad electrodes PEL are spaced apart from one another by a predetermined distance. The upper data pad electrode PEL may have an area relatively larger than the data signal line DSL. Hence, the embodiment of the invention can sufficiently secure a contact area, in which the lower data pad electrode SML and the upper data pad electrode PEL can contact each other, and thus can prevent or minimize a defective contact.

The upper data pad electrode PEL overlaps the convex portion SE1 and extends into at least a portion of the concave portion SE2. For example, the data pad part DP includes a first convex portion SE1_1, a first concave portion SE2_1, a second convex portion SE1_2, and a second concave portion SE2_2, which are sequentially disposed. The upper data pad electrode PEL includes a first upper data pad electrode PEL1 and a second upper data pad electrode PEL2 that are adjacent to each other. The first upper data pad electrode PEL1 is positioned corresponding to the first convex portion SE1_1 and the first concave portion SE2_1, and the second upper data pad electrode PEL2 is positioned corresponding to the second convex portion SE1_2 and the second concave portion SE2_2. This means that the first and second upper data pad electrodes PEL1 and PEL2 are not simultaneously positioned in the same concave portion SE2. In other words, only one upper data pad electrode resides in each concave portion.

The upper data pad electrode PEL may have a shape, in which the upper data pad electrode PEL on the lower data pad electrode SML is shifted in one direction when viewed from the plan, so that the upper data pad electrode PEL can be positioned on the convex portion SE1 and the concave portion SE2 that are adjacent to each other. In other words, each upper data pad electrode can straddle the boundary between adjacent concave and convex portions. All of the upper data pad electrodes PEL are shifted in the same direction.

Referring to FIGS. 10 and 11, a gate insulating layer GI and an interlayer dielectric layer ILD are positioned on the substrate PI of the data pad part DP. The lower data pad electrode SML is positioned on the interlayer dielectric layer ILD. The lower data pad electrode SML is connected to the data signal line DSL. The data signal line DSL indicates a signal line extended from the data line of the display area A/A.

The lower data pad electrode SML may be a pattern that is formed during the same process as the source electrode and the drain electrode of the display area A/A together with them. Thus, the lower data pad electrode SML may be formed on the same layer as the source electrode and the drain electrode of the display area A/A and may include the same material as them.

A passivation layer PAS is positioned on the lower data pad electrode SML. An overcoat layer OC is also positioned on the passivation layer PAS. The overcoat layer OC have a sink groove SH between the adjacent lower data pad electrodes SML. The sink groove SH penetrates the overcoat layer OC and exposes at least a portion of the passivation layer PAS. A formation area of the sink groove SH may be defined as the concave portion SE2, and the outside of the sink groove SH may be defined as the convex portion SE1. The sink groove SH has a sufficient inner space capable of holding the bump CSL of the circuit element CO. In another embodiment, the sink groove SH may penetrate the overcoat layer OC and the passivation layer PAS and may expose a portion of the interlayer dielectric layer ILD.

The overcoat layer OC and the passivation layer PAS include the third contact hole PCNT3. The third contact hole PCNT3 penetrates the overcoat layer OC and the passivation layer PAS and exposes a portion of the lower data pad electrode SML.

The upper data pad electrode PEL is positioned on the overcoat layer OC having the third contact hole PCNT3 and the sink groove SH. The upper data pad electrode PEL is connected to the lower data pad electrode SML through the third contact hole PCNT3. The upper data pad electrode PEL may be formed of a transparent conductive material such as indium tin oxide (ITO), indium zinc oxide (IZO), and zinc oxide (ZnO). The upper data pad electrode PEL may be a pattern that is formed during the same process as the first electrode of the display area A/A together with it. Thus, the upper data pad electrode PEL may be formed on the same layer as the first electrode of the display area A/A and may include the same material as it. Hence, a signal path is formed that connects the upper data pad electrode PEL, the lower data pad electrode SML and the data signal line DSL.

The upper gate pad electrode PEL is formed along a height difference between the convex portion SE1 and the concave portion SE2 and extends to the inside of the concave portion SE2. More specifically, a shape of the concave portion SE2 is defined by a flat surface FF and two inclined surfaces IF1 and IF2 extended from both sides of the flat surface FF. In this instance, the upper data pad electrode PEL covers one of the two inclined surfaces IF1 and IF2 and at least a portion of the flat surface FF.

The circuit element CO includes a bump CSL included in a flexible film SF. An anisotropic conductive film ACF is formed by distributing a plurality of conductive balls in an adhesive resin and electrically connects the pads to the bumps CSL while attaching the substrate PI to the circuit element CO. The conductive balls of the anisotropic conductive film ACF are held in the concave portion SE2 and are positioned between the upper gate pad electrode PEL and the bump CSL, thereby electrically connecting the upper gate pad electrode PEL to the bump CSL.

The concave portion SE2 holds the conductive balls and prevents the separation of the conductive balls. Thus, the conductive balls are not positioned between the bump CSL and the upper gate pad electrode PEL by a pressurization operation provided during a bonding process and are distributed in the concave portion SE2. Hence, the disconnection between the pad and the bump CSL can be prevented.

The movement of the bump CSL is limited by the height difference between the convex portion SE1 and the concave portion SE2 at a boundary between them. Hence, an external force provided can prevent the bump CSL from moving to the outside of the concave portion SE2 or being excessively shifted from its location. In other words, the inclined portions IF1 and IF2 can help hold the bump CSL in place. Thus, a defective contact between the bump CSL and the upper gate pad electrode PEL can be prevented or minimized.

When a bonding process for attaching the circuit element CO to the pad part is performed, the bump CSL may be excessively shifted by a thermal deformation of the flexible film. In this instance, the embodiment of the invention can prevent a misalignment by holding the bump CSL in the concave portion SE2.

When the bumps CSL and the data pads are aligned to attach the circuit element CO to the data pad part GP, the bumps CSL are guided to the inside of the concave portion SE2 due to the shape of the concave portion SE2. Hence, the bumps CSL are self-aligned and accurately aligned at a predetermined location. The embodiment of the invention can easily align the bumps CSL and the pads.

The embodiment of the invention includes the concave portion of the pad part, into which the bump can be inserted, and thus can easily align the pads and the bumps and can prevent a defective contact resulting from changes in an external environment. Further, the embodiment of the invention can secure the reliability and the security of the display device by preventing a defective contact between the pads and the bumps.

Figure 15:
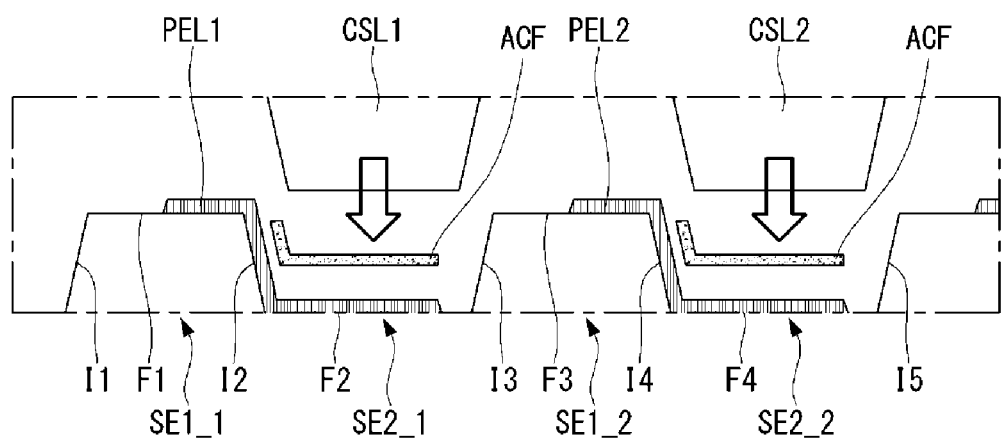
FIG. 15 is a cross-sectional view illustrating a cross-sectional shape of a pad part.

A cross-sectional shape of a pad part and a location of an upper pad electrode are described in detail below with reference to FIG. 15. FIG. 15 is a cross-sectional view illustrating a cross-sectional shape of a pad part. More specifically, FIG. 15 illustrates shapes of a convex portion and a concave portion, and a location of an upper pad electrode and a bump positioned on the convex portion and the concave portion. Other components except the above-mentioned components are omitted in FIG. 15.

Each of pad parts GP and DP includes a first convex portion SE1_1, a first concave portion SE2_1, a second convex portion SE1_2, and a second concave portion SE2_2, which are sequentially disposed. An upper pad electrode includes a first upper pad electrode PEL1 and a second upper pad electrode PEL2 that are adjacent to each other. A bump of a circuit element CO includes a first bump CSL1 and a second bump CSL2, which are adjacent to each other. The first upper pad electrode PEL1 corresponds to the first bump CSL1, and the second upper pad electrode PEL2 corresponds to the second bump CSL2.

A shape of the first convex portion SE1_1 is defined by a first inclined surface I1, a first flat surface F1 connected to a side of the first inclined surface I1 and a second inclined surface I2 connected to a side of the first flat surface F1. A shape of the first concave portion SE2_1 is defined by the second inclined surface I2, a second flat surface F2 connected to a side of the second inclined surface I2 and a third inclined surface I3 connected to a side of the second flat surface F2. A shape of the second convex portion SE1_2 is defined by the third inclined surface I3, a third flat surface F3 connected to a side of the third inclined surface I3 and a fourth inclined surface I4 connected to a side of the third flat surface F3. A shape of the second concave portion SE2_2 is defined by the fourth inclined surface I4, a fourth flat surface F4 connected to a side of the fourth inclined surface I4 and a fifth inclined surface I5 connected to a side of the fourth flat surface F4.

The first upper pad electrode PEL1 covers at least a portion of the first flat surface F1, the second inclined surface I2 and at least a portion of the second flat surface F2. The first bump CSL1 of the circuit element CO is inserted into the first concave portion SE2_1. The first bump CSL1 of the circuit element CO may be connected to the first upper pad electrode PEL1 using an anisotropic conductive film, that is interposed between the first bump CSL1 and the first upper pad electrode PEL1, at a location corresponding to the second flat surface F2. The first bump CSL1 of the circuit element CO may be connected to the first upper pad electrode PEL1 using the anisotropic conductive film, that is interposed between them, at a location corresponding to the second inclined surface I2. This indicates a wide contact area between the first bump CSL1 and the first upper pad electrode PEL1 can be secured.

The second upper pad electrode PEL2 covers at least a portion of the third flat surface F3, the fourth inclined surface I4, and at least a portion of the fourth flat surface F4. The second bump CSL2 of the circuit element CO is inserted into the second concave portion SE2_2. The second bump CSL2 of the circuit element CO may be connected to the second upper pad electrode PEL2 using an anisotropic conductive film, that is interposed between the second bump CSL2 and the second upper pad electrode PEL2, at a location corresponding to the fourth flat surface F4. The second bump CSL2 of the circuit element CO may be connected to the second upper pad electrode PEL2 using the anisotropic conductive film, that is interposed between them, at a location corresponding to the fourth inclined surface I4. Thus, a wide contact area between the second bump CSL2 and the second upper pad electrode PEL2 can be secured.

The first and second upper pad electrodes PEL1 and PEL2 are not positioned on the third inclined surface I3. Hence, a separation distance between the first and second upper pad electrodes PEL1 and PEL2 can be sufficiently secured, and a defective contact between the first and second upper pad electrodes PEL1 and PEL2 can be prevented.

It is preferable, but not required, that the second upper pad electrode PEL2 is positioned only in a portion of the third flat surface F3. Hence, the connection between the second upper pad electrode PEL2 and the first bump CSL1, which do not correspond to each other, can be prevented.

A location of the first upper pad electrode PEL1 at the second flat surface F2 may be properly selected in consideration of a sufficient contact area between the first bump CSL1 and the first upper pad electrode PEL1. A location of the second upper pad electrode PEL2 at the fourth flat surface F4 may be properly selected in consideration of a sufficient contact area between the second bump CSL2 and the second upper pad electrode PEL2. In addition, the locations of the first and second upper pad electrodes PEL1 and PEL2 may be properly selected in consideration of the separation distance between the first and second upper pad electrodes PEL1 and PEL2 for preventing the defective contact.

Second Embodiment

Figure 12:
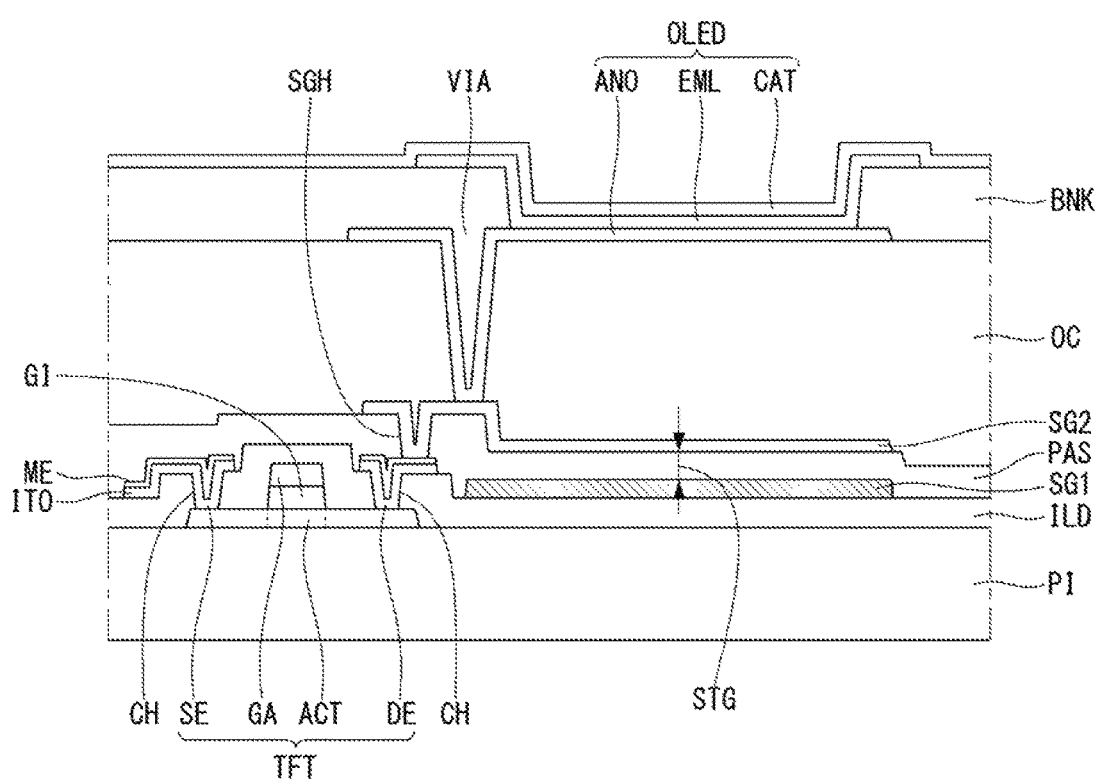
FIG. 12 is a cross-sectional view illustrating a subpixel of an OLED display according to a second embodiment of the invention.
Figure 13:
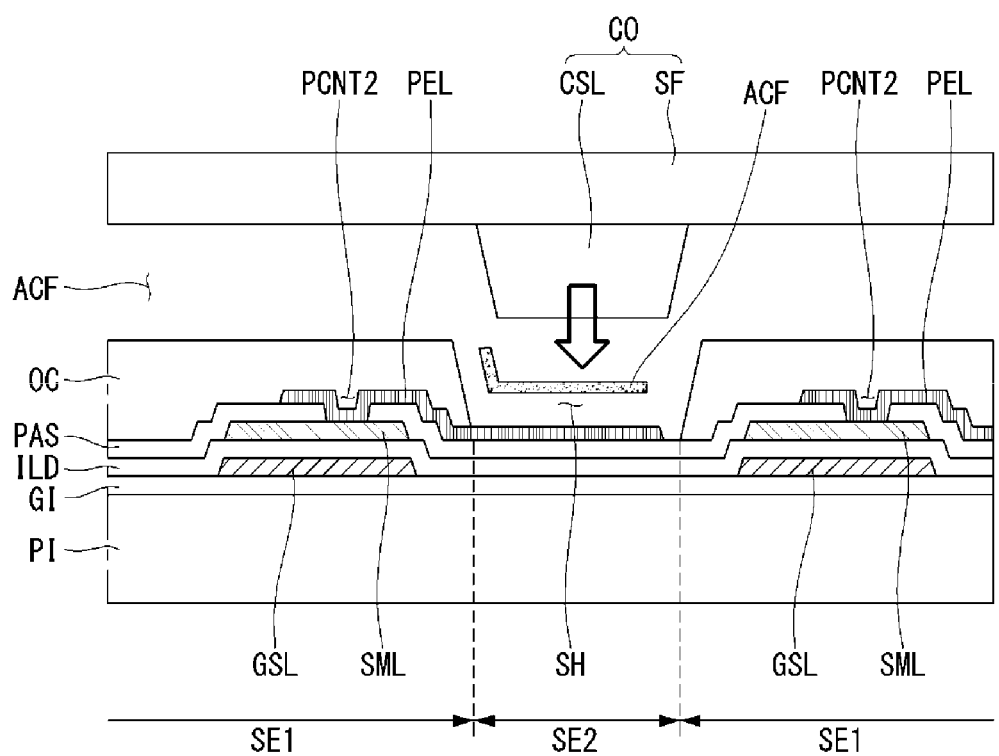
FIG. 13 is a cross-sectional view of a gate pad part according to a second embodiment of the invention.
Figure 14:
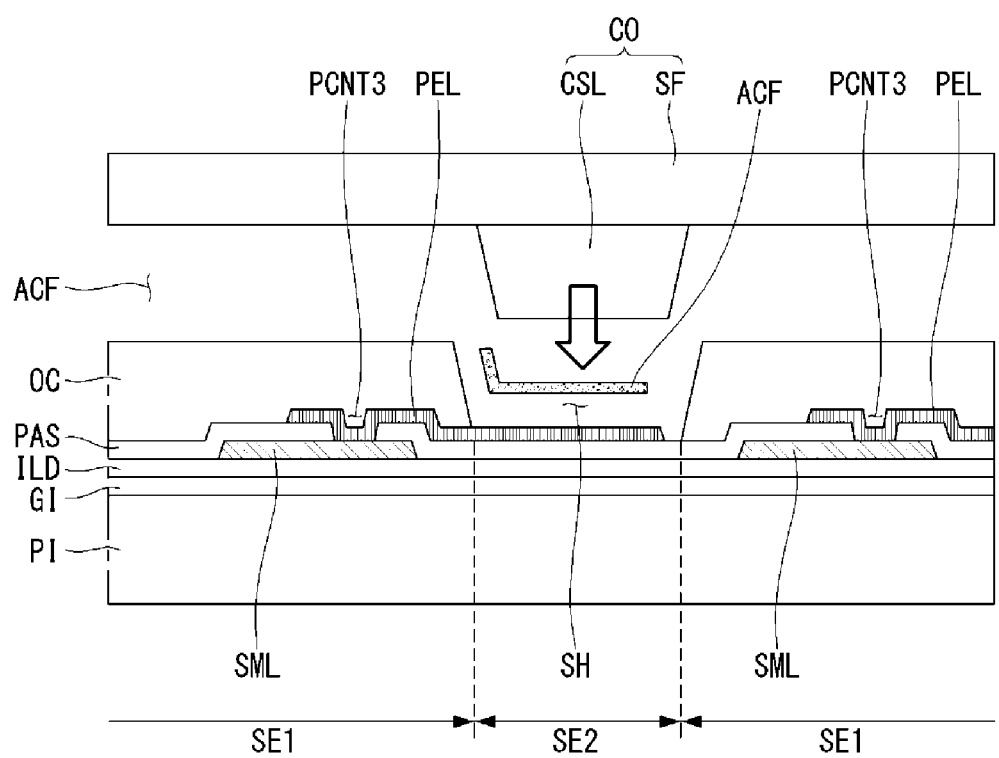
FIG. 14 is a cross-sectional view of a data pad part according to a second embodiment of the invention.

FIG. 12 is a cross-sectional view illustrating a subpixel of an OLED display according to a second embodiment of the invention. FIG. 13 is a cross-sectional view of a gate pad part according to the second embodiment of the invention. FIG. 14 is a cross-sectional view of a data pad part according to the second embodiment of the invention. The cross-sectional view of FIG. 13 may correspond to a cross-sectional view taken along line II-II' of FIG. 6, and the cross-sectional view of FIG. 14 may correspond to a cross-sectional view taken along line IV-IV' of FIG. 9.

Referring to FIG. 12, an OLED display according to a second embodiment of the invention includes a substrate PI. The substrate PI may be made of plastic material. For example, the substrate PI may include at least one of polyimide (PI), polyethylene terephthalate (PET), polyethylene naphthalate (PEN), polycarbonate (PC), polyethersulfone (PES), polyarylate (PAR), polysulfone (PSF), or cyclic olefin copolymer (COC).

In addition, a buffer layer and a shield layer may be formed on the substrate PI. For example, the buffer layer may include a first buffer layer and a second buffer layer, and the shield layer may be interposed between the first buffer layer and the second buffer layer. The first buffer layer may protect a thin film transistor formed in a subsequent process from impurities, for example, alkali ions discharged from the substrate PI. The first buffer layer may be a silicon oxide (SiOx) layer, a silicon nitride (SiNx) layer, or a multilayer thereof. The shield layer may prevent a reduction in a panel driving current which may be generated by using a polyimide substrate. The second buffer may protect a thin film transistor formed in a subsequent process from impurities, for example, alkali ions discharged from the shield layer. The second buffer layer may be a silicon oxide (SiOx) layer, a silicon nitride (SiNx) layer, or a multilayer thereof.

A semiconductor layer ACT is positioned on the substrate PI and may be formed of a silicon semiconductor or an oxide semiconductor. The silicon semiconductor may include amorphous silicon or crystallized polycrystalline silicon. The polycrystalline silicon has a high mobility (for example, more than 100 $cm^2/Vs$), low energy power consumption, and excellent reliability, and thus can be applied to a gate driver and/or a multiplexer (MUX) for use in a driving element or applied to a driving TFT of each pixel of the OLED display. Because the oxide semiconductor has a low off-current, the oxide semiconductor is suitable for a switching TFT that has a short on-time and a long off-time. Further, because the oxide semiconductor increases a voltage hold time of the pixel due to the low off-current, the oxide semiconductor is suitable for a display device requiring a low-speed drive and/or low power consumption. In addition, the semiconductor layer ACT includes a drain region and a source region each including p-type or n-type impurities, and also includes a channel region between the drain region and the source region.

A gate insulating layer GI is positioned on the semiconductor layer ACT. The gate insulating layer GI and a gate electrode GA may be patterned using one mask and may be formed to have the same area. However, the embodiment of the invention is not limited thereto. For example, the gate insulating layer GI may be formed on the entire surface of the substrate PI so as to cover the gate electrode GA. The gate insulating layer GI may be a silicon oxide (SiOx) layer, a silicon nitride (SiNx) layer, or a multilayer thereof. The gate electrode GA is positioned on the gate insulating layer GI at a location corresponding to the channel region of the semiconductor layer ACT. The gate electrode GA may be formed of one of molybdenum (Mo), aluminum (Al), chrome (Cr), gold (Au), titanium (Ti), nickel (Ni), neodymium (Nd), and copper (Cu), or a combination thereof. Further, the gate electrode GA may be a multilayer formed of one of molybdenum (Mo), aluminum (Al), chrome (Cr), gold (Au), titanium (Ti), nickel (Ni), neodymium (Nd), and copper (Cu), or a combination thereof. For example, the gate electrode GA may be formed as a double layer of Mo/Al—Nd or Mo/Al.

An interlayer dielectric layer ILD is positioned on the gate electrode GA and insulates the gate electrode GA. The interlayer dielectric layer ILD may be a silicon oxide (SiOx) layer, a silicon nitride (SiNx) layer, or a multilayer thereof. Contact holes CH exposing a portion of the semiconductor layer ACT are formed in a portion of each of the interlayer dielectric layer ILD and the gate insulating layer GI.

A drain electrode DE and a source electrode SE are positioned on the interlayer dielectric layer ILD. The drain electrode DE is connected to the semiconductor layer ACT through a drain contact hole CH exposing the drain region of the semiconductor layer ACT, and the source electrode SE is connected to the semiconductor layer ACT through a source contact hole CH exposing the source region of the semiconductor layer ACT. Each of the source electrode SE and the drain electrode DE may be formed as a single layer or a multilayer. For example, the source electrode SE and the drain electrode DE may be formed as a double layer, in which a transparent conductive material and a metal material are sequentially stacked. Examples of the transparent conductive material may include indium tin oxide (ITO), indium zinc oxide (IZO), and zinc oxide (ZnO).

A first storage capacitor electrode SG1 is positioned on the interlayer dielectric layer ILD. When the OLED display is implemented as a bottom emission type OLED display, the first storage capacitor electrode SG1 may be formed of a transparent conductive material. For example, the drain electrode DE and the source electrode SE may be formed as a double layer, in which a transparent conductive material ITO and a metal material ME are stacked using a halftone mask, and the first storage capacitor electrode SG1 may be formed as a single layer including a transparent conductive material ITO. However, the embodiment of the invention is not limited thereto. Further, when the OLED display is implemented as a top emission type OLED display, the first storage capacitor electrode SG1 may be formed of an opaque conductive material. Hence, a thin film transistor TFT including the semiconductor layer ACT, the gate electrode GA, the source electrode SE, and the drain electrode DE is formed.

Further, a passivation layer PAS is positioned on the substrate PI including the thin film transistor TFT. The passivation layer PAS is an insulating layer protecting the component underlying the passivation layer PAS and may be a silicon oxide (SiOx) layer, a silicon nitride (SiNx) layer, or a multilayer thereof. Auxiliary contact holes SGH exposing a portion of the drain electrode DE are positioned in a portion of the passivation layer PAS.

A second storage capacitor electrode SG2 is positioned on the passivation layer PAS. The second storage capacitor electrode SG2 is electrically connected to the drain electrode DE through the auxiliary contact hole SGH exposing a portion of the drain electrode DE. When the OLED display is implemented as the bottom emission type OLED display, the second storage capacitor electrode SG2 may include a transparent conductive material such as indium tin oxide (ITO), indium zinc oxide (IZO), and zinc oxide (ZnO). However, the embodiment of the invention is not limited thereto. Further, when the OLED display is implemented as the top emission type OLED display, the second storage capacitor electrode SG2 may include an opaque conductive material.

In the bottom emission type OLED display, when the storage capacitor electrodes SG1 and SG2 include the transparent conductive material, the storage capacitor electrodes SG1 and SG2 may transmit light emitted from an emission layer EML. Thus, an area of the storage capacitor electrodes SG1 and SG2 may be extended to an emission area as well as a non-emission area. Hence, a storage capacitance can be sufficiently secured in a limited area.

An overcoat layer OC is positioned on the second storage capacitor electrode SG2. The overcoat layer OC may be a planarization layer for reducing a height difference of an underlying structure and may be formed of an organic material such as polyimide, benzocyclobutene-based resin, and acrylate. For example, the overcoat layer OC may be formed through a spin-on glass (SOG) method for coating the organic material in a liquid state and then curing the organic material.

A via hole VIA exposing the second storage capacitor electrode SG2 is positioned in a portion of the overcoat layer OC. An organic light emitting diode OLED is positioned on the overcoat layer OC. More specifically, a first electrode ANO is positioned on the overcoat layer OC. The first electrode ANO serves as a pixel electrode and connects to the second storage capacitor electrode SG2 through the via hole VIA. The first electrode ANO is electrically connected to the drain electrode DE of the thin film transistor TFT through the second storage capacitor electrode SG2. The first electrode ANO is an anode and may be formed of a transparent conductive material such as indium tin oxide (ITO), indium zinc oxide (IZO), and zinc oxide (ZnO). When the OLED display is implemented as the top emission type OLED display, the first electrode ANO may further include a reflective layer. The reflective layer may be formed of aluminum (Al), copper (Cu), silver (Ag), nickel (Ni), palladium (Pd) or a combination thereof. Preferably, the reflective layer may be formed of an Ag/Pd/Cu (APC) alloy.

In addition, a bank layer BNK defining pixels is positioned on the substrate PI including the first electrode ANO. The bank layer BNK may be formed of an organic material such as polyimide, benzocyclobutene-based resin, and acrylate. The bank layer BNK exposes a portion of the first electrode ANO. The emission layer EML is positioned on the first electrode ANO exposed by the bank layer BNK. The emission layer EML is a layer, in which electrons and holes combine and emit light. A hole injection layer and/or a hole transport layer may be positioned between the emission layer EML and the first electrode ANO, and an electron injection layer and/or an electron transport layer may be positioned on the emission layer EML.

A second electrode CAT is positioned on the emission layer EML and may be positioned on an entire surface of the display area A/A of the substrate PI. In addition, the second electrode CAT is a cathode electrode and may be formed of magnesium (Mg), calcium (Ca), aluminum (Al), silver (Ag), or a combination thereof each having a low work function. When the OLED display is implemented as the top emission type OLED display, the second electrode CAT may be thin enough to transmit light. Alternatively, the second electrode CAT may be may be formed of a transparent conductive material such as indium tin oxide (ITO), indium zinc oxide (IZO), and zinc oxide (ZnO).

Referring to FIG. 13, a display device according to the second embodiment of the invention includes a gate pad part GP positioned on a substrate PI. The gate pad part GP includes a convex portion SE1 and a concave portion SE2. The convex portion SE1 has a cross-sectional shape that convexly protrudes, and the concave portion SE2 has a cross-sectional shape that is concavely depressed. The convex portion SE1 and the concave portion SE2 are alternately disposed, and a height different is generated at a boundary between the convex portion SE1 and the concave portion SE2.

The convex portion SE1 and the concave portion SE2 may be formed by patterning at least one insulating layer. Namely, at least one insulating layer on the substrate PI may have a sink groove SH. In this instance, a formation area of the sink groove SH may be defined as the concave portion SE2. A portion of the patterned insulating layer, that remains outside the sink groove SH, may be defined as the convex portion SE1. The insulating layer pattern may cause the convex portion SE1 and the concave portion SE2 to have a sufficient height difference between them.

A bump CSL of a circuit element CO is positioned in the concave portion SE2. Namely, the gate pad part GP includes the plurality of concave portions SE2, and the plurality of bumps CSL may be respectively inserted into the plurality of concave portions SE2. The concave portion SE2 has an inner space capable of holding the bump CSL.

The gate pad part GP includes a plurality of gate pads. Each gate pad includes a lower gate pad electrode SML and an upper gate pad electrode PEL.

The lower gate pad electrode SML is connected to a gate signal line GSL. The lower gate pad electrode SML and the gate signal line GSL are electrically connected to each other through a contact hole penetrating at least one insulating layer with at least one insulating layer interposed between them.

The upper gate pad electrode PEL is connected to the lower gate pad electrode SML. The upper gate pad electrode PEL and the lower gate pad electrode SML are electrically connected to each other through a second contact hole PCNT2 penetrating at least one insulating layer with at least one insulating layer interposed between them. The upper gate pad electrode PEL is electrically connected to the lower gate pad electrode SML, the gate signal line GSL and the gate line of the display area A/A, and transfers a gate signal supplied through the circuit element CO to the subpixel of the display area A/A. The upper gate pad electrode PEL overlaps the convex portion SE1 and extends to at least a portion of the concave portion SE2.

In the first embodiment, an insulating layer pattern (i.e., an insulating layer pattern having the sink groove SH) forming the convex portion SE1 and the concave portion SE2 is disposed between the lower gate pad electrode SML and the upper gate pad electrode PEL. On the other hand, in the second embodiment, an insulating layer pattern forming the convex portion SE1 and the concave portion SE2 is disposed on the upper gate pad electrode PEL. Thus, an insulating layer according to the second embodiment is disposed to cover the upper gate pad electrode PEL in the convex portion SE1 and exposes the upper gate pad electrode PEL in the concave portion SE2. The upper gate pad electrode PEL exposed to the outside in the concave portion SE2 is electrically connected to the bump CSL using an anisotropic conductive film.

More specifically, a gate insulating layer GI is positioned on the substrate PI of the gate pad part GP. The gate signal line GSL is positioned on the gate insulating layer GI and indicates a signal line extended from the gate line of the display area A/A.

An interlayer dielectric layer ILD is positioned on the gate signal line GSL, and the lower gate pad electrode SML is positioned on the interlayer dielectric layer ILD. The lower gate pad electrode SML is connected to the gate signal line GSL through a contact hole penetrating the interlayer dielectric layer ILD. The lower gate pad electrode SML may be a pattern that is formed during the same process as the source electrode and the drain electrode of the display area A/A together with them. Thus, the lower gate pad electrode SML may be formed on the same layer as the source electrode and the drain electrode of the display area A/A and may include the same material as them.

A passivation layer PAS is positioned on the lower gate pad electrode SML and includes a second contact hole PCNT2. The second contact hole PCNT2 penetrates the passivation layer PAS and exposes a portion of the lower gate pad electrode SML.

The upper gate pad electrode PEL is positioned on the passivation layer PAS having the second contact hole PCNT2. The upper gate pad electrode PEL is connected to the lower gate pad electrode SML through the second contact hole PCNT2.

The upper gate pad electrode PEL may be a pattern that is formed during the same process as the source and drain electrodes SE and DE (see FIG. 12) and/or the second storage capacitor electrode SG2 (see FIG. 12) of the display area A/A together with them. Thus, the upper gate pad electrode PEL may be formed on the same layer as the source and drain electrodes SE and DE and/or the second storage capacitor electrode SG2 of the display area A/A and may include the same material as them.

When the display device is implemented as a bottom emission type display device, the second storage capacitor electrode SG2 and the upper gate pad electrode PEL may be formed of a transparent conductive material such as indium tin oxide (ITO), indium zinc oxide (IZO), and zinc oxide (ZnO). However, the embodiment of the invention is not limited thereto. Further, when the display device is implemented as a top emission type display device, the second storage capacitor electrode SG2 and the upper gate pad electrode PEL may be formed of an opaque conductive material.

The upper gate pad electrode PEL in the convex portion SE1 is connected to the lower gate pad electrode SML and extends to the inside of the concave portion SE2. The upper gate pad electrode PEL is positioned corresponding to the convex portion SE1 and the concave portion SE2. Hence, a signal path is formed that connects the upper gate pad electrode PEL, the lower gate pad electrode SML and the gate signal line GSL.

An overcoat layer OC is positioned on the upper gate pad electrode PEL and includes a sink groove SH between the adjacent lower gate pad electrodes SML. The sink groove SH penetrates the overcoat layer OC and exposes a portion of the upper gate pad electrode PEL. A formation area of the sink groove SH may be defined as the concave portion SE2, and the outside of the sink groove SH may be defined as the convex portion SE1. The sink groove SH has a sufficient inner space capable of holding the bump CSL of the circuit element CO.

The circuit element CO includes a bump CSL included in a flexible film SF. An anisotropic conductive film ACF is formed by distributing a plurality of conductive balls in an adhesive resin and electrically connects the pads to the bumps CSL while attaching the substrate PI to the circuit element CO. The conductive balls of the anisotropic conductive film ACF are held in the concave portion SE2 and are positioned between the upper gate pad electrode PEL and the bump CSL, thereby electrically connecting the upper gate pad electrode PEL to the bump CSL.

The second embodiment of the invention is configured such that the upper gate pad electrode PEL is exposed only in the concave portion SE2, unlike the first embodiment of the invention. Because the convex portion SE1 is positioned between the adjacent concave portions SE2, the upper gate pad electrodes PEL exposed to the outside in the adjacent concave portions SE2 may be spaced apart from one another at a sufficient distance. Hence, the second embodiment of the invention can prevent or minimize a defective contact.

Referring to FIG. 14, the display device according to the second embodiment of the invention includes a data pad part DP positioned on the substrate PI. The data pad part DP includes a convex portion SE1 and a concave portion SE2. The convex portion SE1 has a cross-sectional shape that convexly protrudes, and the concave portion SE2 has a cross-sectional shape that is concavely depressed. The convex portion SE1 and the concave portion SE2 are alternately disposed, and a height different is generated at a boundary between the convex portion SE1 and the concave portion SE2.

The convex portion SE1 and the concave portion SE2 may be formed by patterning at least one insulating layer. Namely, at least one insulating layer on the substrate PI may have a sink groove SH. In this instance, a formation area of the sink groove SH may be defined as the concave portion SE2. A portion of the patterned insulating layer, that remains outside the sink groove SH, may be defined as the convex portion SE1. The insulating layer pattern may cause the convex portion SE1 and the concave portion SE2 to have a sufficient height difference between them.

A bump CSL of a circuit element CO is positioned in the concave portion SE2. Namely, the data pad part DP includes the plurality of concave portions SE2, and the plurality of bumps CSL may be respectively inserted into the plurality of concave portions SE2. The concave portion SE2 has an inner space capable of holding the bump CSL.

The data pad part DP includes a plurality of data pads. Each data pad includes a lower data pad electrode SML and an upper data pad electrode PEL.

The lower data pad electrode SML is connected to a data signal line. The lower data pad electrode SML and the data signal line may be disposed on the same layer and may be formed as one body.

The upper data pad electrode PEL is connected to the lower data pad electrode SML. More specifically, the upper data pad electrode PEL and the lower data pad electrode SML are electrically connected to each other through a third contact hole PCNT3 penetrating at least one insulating layer with at least one insulating layer interposed between them. The upper data pad electrode PEL is electrically connected to the lower data pad electrode SML, the data signal line and the data line of the display area A/A, and transfers a data signal supplied through the circuit element CO to the subpixel of the display area A/A. The upper data pad electrode PEL overlaps the convex portion SE1 and extends into at least a portion of the concave portion SE2.

In the first embodiment, an insulating layer pattern (i.e., an insulating layer pattern having the sink groove SH) forming the convex portion SE1 and the concave portion SE2 is disposed between the lower data pad electrode SML and the upper data pad electrode PEL. On the other hand, in the second embodiment, an insulating layer pattern forming the convex portion SE1 and the concave portion SE2 is disposed on the upper data pad electrode PEL. Thus, an insulating layer pattern, according to the second embodiment, covers the upper data pad electrode PEL in the convex portion SE1 and exposes the upper data pad electrode PEL in the concave portion SE2. The upper data pad electrode PEL, which is exposed to the outside in the concave portion SE2, is electrically connected to the bump CSL using an anisotropic conductive film.

More specifically, a gate insulating layer GI and an interlayer dielectric layer ILD are positioned on the substrate PI of the data pad part DP. The lower data pad electrode SML is positioned on the interlayer dielectric layer ILD and connected to the data signal line. The lower data pad electrode SML and the data signal line may be formed as one body. The data signal line indicates a signal line extended from the data line of the display area A/A.

The lower data pad electrode SML may be a pattern that is formed during the same process as the source electrode and the drain electrode of the display area A/A together with them. Thus, the lower data pad electrode SML may be formed on the same layer as the source electrode and the drain electrode of the display area A/A and may include the same material as them.

A passivation layer PAS is positioned on the lower data pad electrode SML and include a third contact hole PCNT3. The third contact hole PCNT3 penetrates the passivation layer PAS and exposes a portion of the lower data pad electrode SML.

The upper data pad electrode PEL is positioned on the passivation layer PAS having the third contact hole PCNT3. The upper data pad electrode PEL is connected to the lower data pad electrode SML through the third contact hole PCNT3.

The upper data pad electrode PEL may be a pattern that is formed during the same process as the source and drain electrodes SE and DE (see FIG. 12) and/or the second storage capacitor electrode SG2 (see FIG. 12) of the display area A/A together with them. Thus, the upper data pad electrode PEL may be formed on the same layer as the source and drain electrodes SE and DE and/or the second storage capacitor electrode SG2 of the display area A/A and may include the same material as them.

When the display device is implemented as a bottom emission type display device, the second storage capacitor electrode SG2 and the upper data pad electrode PEL may be formed of a transparent conductive material such as indium tin oxide (ITO), indium zinc oxide (IZO), and zinc oxide (ZnO). Further, when the display device is implemented as a top emission type display device, the second storage capacitor electrode SG2 and the upper data pad electrode PEL may be formed of an opaque conductive material.

The upper data pad electrode PEL in the convex portion SE1 is connected to the lower data pad electrode SML and extends into the inside of the concave portion SE2. The upper data pad electrode PEL is positioned corresponding to the convex portion SE1 and the concave portion SE2. Hence, a signal path is formed to connect the upper data pad electrode PEL, the lower data pad electrode SML and the data signal line.

An overcoat layer OC is positioned on the upper data pad electrode PEL and includes a sink groove SH between the adjacent lower data pad electrodes SML. The sink groove SH penetrates the overcoat layer OC and exposes a portion of the upper data pad electrode PEL. A formation area of the sink groove SH may be defined as the concave portion SE2, and the outside of the sink groove SH may be defined as the convex portion SE1. The sink groove SH has a sufficient inner space capable of holding the bump CSL of the circuit element CO.

The circuit element CO includes a bump CSL included in a flexible film SF. An anisotropic conductive film ACF is formed by distributing a plurality of conductive balls in an adhesive resin and electrically connects the pads to the bumps CSL while attaching the substrate PI to the circuit element CO. The conductive balls of the anisotropic conductive film ACF are held in the concave portion SE2 and are positioned between the upper data pad electrode PEL and the bump CSL, thereby electrically connecting the upper data pad electrode PEL to the bump CSL.

The second embodiment of the invention is configured such that the upper data pad electrode PEL is only exposed in the concave portion SE2, unlike the first embodiment of the invention. Because the convex portion SE1 is positioned between the adjacent concave portions SE2, the upper data pad electrodes PEL exposed to the outside in the adjacent concave portions SE2 may be spaced apart from one another by a sufficient distance. Hence, the second embodiment of the invention can prevent or minimize a defective contact.

In addition, when the upper pad electrode PEL is formed of an opaque conductive material, the upper pad electrode PEL exposed to the outside may be oxidized. In order to prevent the oxidation of the upper pad electrode PEL, an auxiliary pad electrode may be additionally formed to cover the upper pad electrode PEL exposed to the outside.

The auxiliary pad electrode may include a transparent conductive material such as indium tin oxide (ITO), indium zinc oxide (IZO), and zinc oxide (ZnO). The auxiliary pad electrode may be an electrode pattern that is formed during the same process as the first electrode ANO (see FIG. 12) on the same layer as the first electrode ANO. Thus, the auxiliary pad electrode may include the same material as the first electrode ANO.

The embodiments of the invention include the concave portion of the pad part, into which the bump can be inserted, and thus can easily align the pads of the pad part and the bumps and can prevent a defective contact resulting from changes in an external environment. Furthermore, the embodiments of the invention can secure the reliability and the security of the display device by preventing the defective contact between the pads and the bumps.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a substrate including a display area, on which an input image is displayed, and a pad part including a convex portion and a concave portion that are alternately positioned outside the display area and have a height difference between them; and
   a circuit element attached to the pad part, the circuit element including a bump inserted into the concave portion of the pad part,
   wherein the pad part includes:
   a lower pad electrode electrically connected to a signal line extended from the display area;
   a first insulating layer disposed on the lower pad electrode in the convex portion; and
   an upper pad electrode disposed on the first insulating layer, connected to the lower pad electrode through a first contact hole penetrating the first insulating layer, and extending into at least a portion of the concave portion,
   wherein the pad part includes a first convex portion, a first concave portion, a second convex portion and a second concave portion that are sequentially disposed,
   wherein the upper pad electrode includes a first upper pad electrode and a second upper pad electrode that are adjacent to each other,
   wherein a shape of the first convex portion includes a first inclined surface, a first flat surface connected to a side of the first inclined surface and a second inclined surface connected to a side of the first flat surface,
   wherein a shape of the first concave portion includes the second inclined surface, a second flat surface connected to a side of the second inclined surface and a third inclined surface connected to a side of the second flat surface,
   wherein a shape of the second convex portion includes the third inclined surface, a third flat surface connected to a side of the third inclined surface and a fourth inclined surface connected to a side of the third flat surface,
   wherein a shape of the second concave portion includes the fourth inclined surface, a fourth flat surface connected to a side of the fourth inclined surface and a fifth inclined surface connected to a side of the fourth flat surface,
   wherein the first upper pad electrode covers at least a portion of the first flat surface, the second inclined surface and at least a portion of the second flat surface, and
   wherein the second upper pad electrode covers at least a portion of the third flat surface, the fourth inclined surface and at least a portion of the fourth flat surface.

2. The display device of claim 1, further comprising an anisotropic conductive film interposed between the pad part and the circuit element,
   wherein the upper pad electrode is connected to the bump in the concave portion through the anisotropic conductive film.

3. The display device of claim 2, wherein the anisotropic conductive film includes an adhesive resin and a plurality of conductive balls distributed in the adhesive resin, and
   wherein the conductive balls are held in the concave portion.

4. The display device of claim 1, wherein a shape of the concave portion includes a flat surface and two inclined surfaces extended from both sides of the flat surface, and
   wherein the upper pad electrode covers one of the two inclined surfaces and covers at least a portion of the flat surface.

5. The display device of claim 1, wherein the pad part further includes a second insulating layer between the lower pad electrode and the first insulating layer.

6. The display device of claim 5, wherein the second insulating layer is disposed only in the convex portion of the pad part.

7. The display device of claim 1, wherein the signal line is disposed under the lower pad electrode with a third insulating layer interposed between them, is connected to the lower pad electrode through a third contact hole penetrating the third insulating layer, and is connected to a gate line of the display area.

8. The display device of claim 1, wherein the signal line is disposed on the same layer as the lower pad electrode, is connected to the lower pad electrode, and is connected to a data line of the display area.

9. The display device of claim 1, wherein the display area includes a plurality of subpixels, and
   wherein each subpixel includes:
   a semiconductor layer positioned on the substrate;
   a gate electrode positioned on the semiconductor layer with a gate insulating layer interposed between them and partially overlapping the semiconductor layer;
   a source electrode and a drain electrode positioned on an interlayer dielectric layer covering the gate electrode and respectively connected to both sides of the semiconductor layer through a source contact hole and a drain contact hole penetrating the interlayer dielectric layer; and
   a first electrode positioned on a passivation layer and an overcoat layer covering the source electrode and the drain electrode, and connected to the drain electrode through a via hole penetrating the passivation layer and the overcoat layer,
   wherein the upper pad electrode is disposed on the same layer as the first electrode and includes the same material as the first electrode.

10. A display device comprising:
    a substrate including a display area, on which an input image is displayed, and a pad part including a convex portion and a concave portion that are alternately positioned outside the display area and have a height difference between them; and a circuit element attached to the pad part, the circuit element including a bump inserted into the concave portion of the pad part, wherein the pad part includes:

a lower pad electrode electrically connected to a signal line extended from the display area;

a first insulating layer covering the lower pad electrode;

an upper pad electrode disposed on the first insulating layer, connected to the lower pad electrode in the convex portion through a first contact hole penetrating the first insulating layer, and extending into at least a portion of the concave portion; and a second insulating layer disposed on the upper pad electrode and exposing the upper pad electrode in the concave portion, wherein the pad part includes a first convex portion, a first concave portion, a second convex portion and a second concave portion that are sequentially disposed, wherein the upper pad electrode includes a first upper pad electrode and a second upper pad electrode that are adjacent to each other, wherein the first upper pad electrode is positioned corresponding to the first convex portion and the first concave portion, wherein the second upper pad electrode is positioned corresponding to the second convex portion and the second concave portion, wherein the lower pad electrode includes a first lower pad electrode connected to the first upper pad electrode and a second lower pad electrode connected to the second upper pad electrode, wherein the first upper pad electrode is shifted in one direction with respect to the first lower pad electrode, and wherein the second upper pad electrode is shifted in the one direction with respect to the second lower pad electrode.

11. The display device of claim 10, further comprising an anisotropic conductive film interposed between the pad part and the circuit element, wherein the upper pad electrode is connected to the bump in the concave portion through the anisotropic conductive film.

12. The display device of claim 11, wherein the anisotropic conductive film includes an adhesive resin and a plurality of conductive balls distributed in the adhesive resin, and wherein the conductive balls are held in the concave portion.

13. The display device of claim 10, wherein a shape of the concave portion includes a flat surface and two inclined surfaces extended from both sides of the flat surface, and wherein the upper pad electrode covers one of the two inclined surfaces and covers at least a portion of the flat surface.

14. The display device of claim 10, wherein the signal line is disposed under the lower pad electrode with a third insulating layer interposed between them, is connected to the lower pad electrode through a third contact hole penetrating the third insulating layer, and is electrically connected to a gate line of the display area.

15. The display device of claim 10, wherein the signal line is disposed on the same layer as the lower pad electrode, is connected to the lower pad electrode, and is connected to a data line of the display area.

16. The display device of claim 10, wherein the display area includes a plurality of subpixels, and wherein each subpixel includes:

a semiconductor layer positioned on the substrate;

a gate electrode positioned on the semiconductor layer with a gate insulating layer interposed between them and partially overlapping the semiconductor layer;

a source electrode and a drain electrode positioned on an interlayer dielectric layer covering the gate electrode and respectively connected to both sides of the semiconductor layer through a source contact hole and a drain contact hole penetrating the interlayer dielectric layer;

a first storage capacitor electrode positioned on the interlayer dielectric layer;

a second storage capacitor electrode positioned on a passivation layer covering the source electrode and the drain electrode, overlapping the first storage capacitor electrode and connected to the drain electrode through an auxiliary contact hole penetrating the passivation layer; and a first electrode positioned on an overcoat layer covering the first storage capacitor electrode and connected to the drain electrode through a via hole penetrating the overcoat layer, wherein the upper pad electrode is disposed on the same layer as the second storage capacitor electrode and includes the same material as the second storage capacitor electrode.

17. The display device of claim 16, further comprising an auxiliary pad electrode covering the exposed upper pad electrode in the concave portion, wherein the auxiliary pad electrode is disposed on the same layer as the first electrode and includes the same material as the first electrode.

18. The display device of claim 16, wherein the first and second storage capacitor electrodes include a transparent conductive material.

* * * * *